US010050174B2

(12) United States Patent
Shur et al.

(10) Patent No.: US 10,050,174 B2
(45) Date of Patent: Aug. 14, 2018

(54) DEVICE WITH TRANSPARENT AND HIGHER CONDUCTIVE REGIONS IN LATERAL CROSS SECTION OF SEMICONDUCTOR LAYER

(71) Applicant: Sensor Electronic Technology, Inc., Columbia, SC (US)

(72) Inventors: Michael Shur, Latham, NY (US); Maxim S. Shatalov, Columbia, SC (US); Alexander Dobrinsky, Loudonville, NY (US); Remigijus Gaska, Columbia, SC (US); Jinwei Yang, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/457,088

(22) Filed: Mar. 13, 2017

(65) Prior Publication Data
US 2017/0186910 A1 Jun. 29, 2017

Related U.S. Application Data

(63) Continuation of application No. 15/200,313, filed on Jul. 1, 2016, now Pat. No. 9,595,634, which is a
(Continued)

(51) Int. Cl.
*H01L 33/06* (2010.01)
*H01L 33/32* (2010.01)
(Continued)

(52) U.S. Cl.
CPC .......... *H01L 33/06* (2013.01); *H01L 33/0025* (2013.01); *H01L 33/22* (2013.01);
(Continued)

(58) Field of Classification Search
CPC ..... H01L 33/06; H01L 33/0025; H01L 33/22; H01L 33/325; H01L 33/405; H01S 5/125;
(Continued)

(56) References Cited

U.S. PATENT DOCUMENTS 6,560,259 B1 5/2003 Hwang
7,812,366 B1 10/2010 Sampath et al.
(Continued)

FOREIGN PATENT DOCUMENTS

TW 201121101 A 6/2011

OTHER PUBLICATIONS

Bell et al., "Exciton freeze-out and thermally activated relaxation at local potential fluctuations in thick $Al_xGa_{1-x}N$ layers", J. Appl. Phys., vol. 95, No. 9, May 1, 2004, pp. 4671-4674.
(Continued)

*Primary Examiner* — Armando Rodriguez
(74) *Attorney, Agent, or Firm* — Labatt, LLC

(57) ABSTRACT

A device including one or more layers with lateral regions configured to facilitate the transmission of radiation through the layer and lateral regions configured to facilitate current flow through the layer is provided. The layer can comprise a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range.

20 Claims, 23 Drawing Sheets

Related U.S. Application Data continuation-in-part of application No. 14/721,082, filed on May 26, 2015, now Pat. No. 9,385,271, which is a continuation-in-part of application No. 14/531,162, filed on Nov. 3, 2014, now Pat. No. 9,042,420, which is a continuation of application No. 14/184,649, filed on Feb. 19, 2014, now Pat. No. 8,879,598, which is a continuation-in-part of application No. 13/572,446, filed on Aug. 10, 2012, now Pat. No. 8,787,418.

(60) Provisional application No. 62/090,101, filed on Dec. 10, 2014, provisional application No. 61/768,692, filed on Feb. 25, 2013, provisional application No. 61/600,701, filed on Feb. 19, 2012, provisional application No. 61/522,425, filed on Aug. 11, 2011.

(51) Int. Cl.
| | |
|---|---|
| *H01L 33/22* | (2010.01) |
| *H01L 33/00* | (2010.01) |
| *H01L 33/40* | (2010.01) |
| *H01S 5/125* | (2006.01) |
| *H01S 5/30* | (2006.01) |
| *H01S 5/343* | (2006.01) |

(52) U.S. Cl.
CPC .......... *H01L 33/325* (2013.01); *H01L 33/405* (2013.01); *H01S 5/125* (2013.01); *H01S 5/3054* (2013.01); *H01S 5/3063* (2013.01); *H01S 5/343* (2013.01); *H01S 5/34346* (2013.01)

(58) Field of Classification Search
CPC ...... H01S 5/3054; H01S 5/3063; H01S 5/343; H01S 5/34346
See application file for complete search history.

(56) References Cited

U.S. PATENT DOCUMENTS

| | | | |
|---|---|---|---|
| 8,787,418 | B2 | 7/2014 | Shur et al. |
| 8,879,598 | B2 | 11/2014 | Shur et al. |
| 9,385,271 | B2 | 7/2016 | Shur et al. |
| 9,595,634 | B2 * | 3/2017 | Shur ............. H01L 33/06 |
| 2004/0140531 | A1 | 7/2004 | Werner et al. |
| 2004/0159851 | A1 | 8/2004 | Edmond et al. |
| 2006/0118820 | A1 | 6/2006 | Gaska et al. |
| 2007/0295952 | A1 | 12/2007 | Jang et al. |
| 2008/0093593 | A1 | 4/2008 | Ryu |
| 2010/0320440 | A1 | 12/2010 | Khan |
| 2011/0138341 | A1 | 6/2011 | Shatalov et al. |
| 2011/0140076 | A1 | 6/2011 | Song |
| 2011/0168979 | A1 | 7/2011 | Shur et al. |
| 2011/0253975 | A1 | 10/2011 | Shatalov et al. |
| 2011/0266520 | A1 | 11/2011 | Shur et al. |
| 2011/0309326 | A1 | 12/2011 | Gaska et al. |
| 2012/0113658 | A1 | 5/2012 | Sakai |
| 2013/0292638 | A1 | 11/2013 | Shur et al. |

OTHER PUBLICATIONS

Chen, C.H. et al., "Mechanism of enhanced luminescence in $InxAlyGa1\bar{A}x\bar{A}yN$ quaternary epilayers", Appl. Phys. Lett., vol. 84, No. 9, Mar. 1, 2004, pp. 1480-1482.
Chichibu, S. et al., "Luminescences from localized states in InGaN epilayers", Appl. Phys. Lett., vol. 70, No. 21, May 26, 1997, pp. 2822-2824.
Chichibu, S. et al., "Spatially resolved cathodoluminescence spectra of InGaN quantum wells", Appl. Phys. Lett., vol. 71, No. 16, Oct. 20, 1997, pp. 2346-2348.
Cho, Y-H. et al., "Dynamics of anomalous optical transitions in $AlxGa1\bar{A}xN$ alloys", Physical Review B, vol. 61, No. 11, Mar. 15, 2000, 4 pages.
Collins, C.J. et al., "Enhanced room-temperature luminescence efficiency through carrier localization in AlxGa1—xN alloys", Appl. Phys. Lett. 86, 031916 ~2005, 4 pages.
Hirayama, H. et al., "Marked enhancement of 320-360 nm ultraviolet emission in quaternary $InxAlyGa1\bar{A}x\bar{A}yN$ with In-segregation effect", Appl. Phys. Lett., vol. 80, No. 2, Jan. 14, 2002, pp. 207-209.
Kazlauskas, K. et al., "Double-scaled potential profile in a group-III nitride alloy revealed by Monte Carlo simulation of exciton hopping", Appl. Phys. Lett., vol. 83, No. 18, Nov. 3, 2003, pp. 3722-3724.
Kim, Y-W. et al., "Dislocation behavior in InGaNÖGaN multi-quantum-well structure grown by metalorganic chemical vapor deposition", Appl. Phys. Lett., vol. 80, No. 21, May 27, 2002, pp. 3949-3951.
Lee, S. et al., "Carrier transport by formation of two-dimensional hole gas in p-type Al0.1Ga0.9N/GaN superlattice for AlGaInN-based laser diode", Journal of Crystal Growth 287 (2006) 554-557.
Lee, Y-B. et al., "Fabrication of High-Output-Power AlGaN/GaN-Based UV-Light-Emitting Diode Using a Ga Droplet Layer", Jpn. J. Appl. Phys. vol. 41 (2002) pp. L 1037-L 1039, Part 2, No. 10A, Oct. 1, 2002.
Lee et al., "Investigation of optical andelectrical properties of Mg-doped p-InxGa1xN, p-GaN andp-Al yGa1yN grown by MOCVD", Journal of Crystal Growth 272 (2004) 455-459.
Monroy, E. et al., "Molecular-beam epitaxial growth and characterization of quaternary III-nitride compounds", J. Appl. Phys., vol. 94, No. 5, Sep. 1, 2003, pp. 3121-3127.
Oh, E. et al., "Mg concentration dependence of optical properties in GaN : Mg," Journal of Crystal Growth 189/190 (1998) 537-540.
Pinos, A. et al., "Localization potentials in AlGaN epitaxial films studied by scanning nearfield optical spectroscopy", J. Appl. Phys. 109, 113516 (2011), 8 pgs.
Ryu, M-Y. et al., "Luminescence mechanisms in quaternary $AlxInyGa1\bar{A}x\bar{A}yN$ materials", Appl. Phys. Lett., vol. 80, No. 20, May 20, 2002, pp. 3730-3732.
Sampath, A.V. et al., "Characterization of nanometer scale compositionally inhomogeneous AlGaN active regions on bulk AlN substrates", Solid-State Electronics 54 (2010) 1130-1134.
Sampath, A.V et al., "Growth of AlGaN containing nanometer scale compositional inhomogeneities for ultraviolet light emitters", J. Vac. Sci. Technol. B 29 (3), May/Jun. 2011, 5 pages.
Shen, P.H. et al., "Mechanisms of Enhanced Luminescence in Nanoscale Compositionally Inhomogeneous AlGaN", ECS Trans. 2006, vol. 3, Issue 5, pp. 181-187.
Sun, Y. et al., "Carrier dynamics of high-efficiency green light emission in graded-indium-content InGaNÖGaN quantum wells: An important role of effective carrier transfer", Appl. Phys. Lett., vol. 84, No. 1, Jan. 5, 2004, pp. 49-51.
Tamulaitis, G. et al., "Optical bandgap formation in AlInGaN alloys", Appl. Phys. Lett., vol. 77, No. 14, Oct. 2, 2000, pp. 2136-2138.
Waltereit, P. et al., "Blue GaN-based light-emitting diodes grown by molecular-beam epitaxy with external quantum efficiency greater than 1.5%", Appl. Phys. Lett., vol. 84, No. 15, Apr. 12, 2004, pp. 2748-2750.
Rodriguez, A., U.S. Appl. No. 13/572,446, Notice of Allowance, dated Mar. 24, 2014, 9 pages.
Rodriguez, A., U.S. Appl. No. 13/572,446, Non-Final Rejection, dated Jan. 2, 2014, 21 pages.
Rodriguez, A., U.S. Appl. No. 14/184,649, Notice of Allowance, dated Jul. 8, 2014, 16 pages.
Rodriguez, A., U.S. Appl. No. 14/531,162, Notice of Allowance, dated Jan. 29, 2015, 16 pages.
Rodriguez, A., U.S. Appl. No. 14/721,082, Notice of Allowance, dated Mar. 7, 2016, 11 pages.
Rodriguez, A., U.S. Appl. No. 14/721,082, Office Action1, dated Dec. 4, 2015, 19 pages.
Taiwan Application No. 101129256, Office Action (with English translation), dated Aug. 11, 2014, 6 pages.

(56) References Cited

OTHER PUBLICATIONS

Taiwan Application No. 101129256, Translation of Allowed Claims, Nov. 2014, 4 pages.
Park, International Application No. PCT/US2012/050486, Search Report and the Written Opinion, dated Jan. 29, 2013, 10 pages.
Rodriguez, A., U.S. Appl. No. 15/200,313, Notice of Allowance, dated Nov. 4, 2016, 17 pages.

* cited by examiner

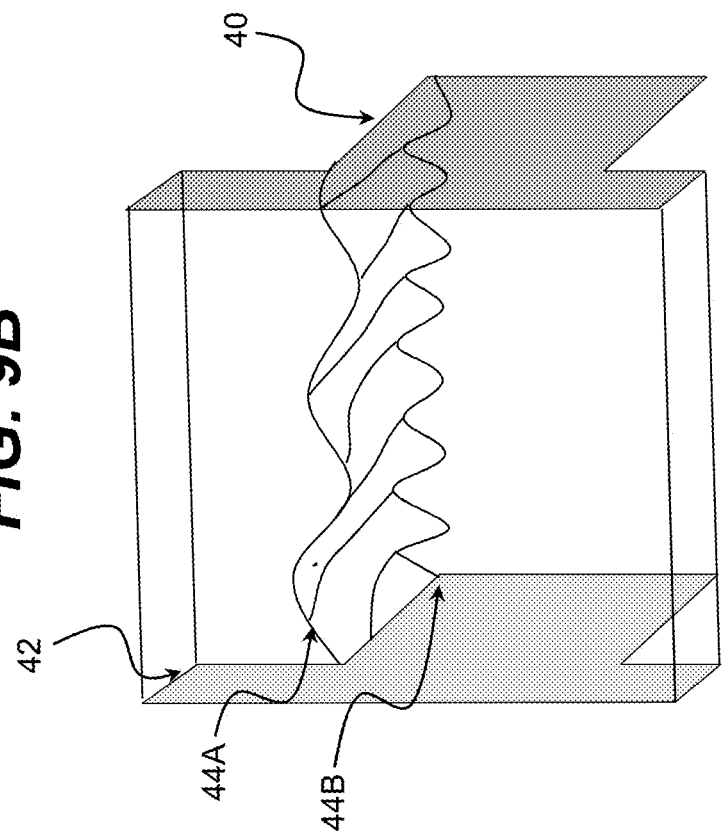
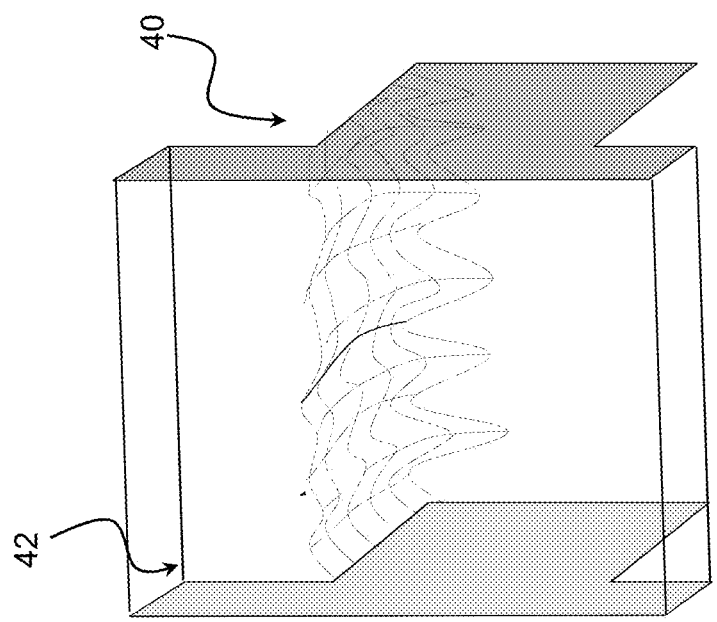

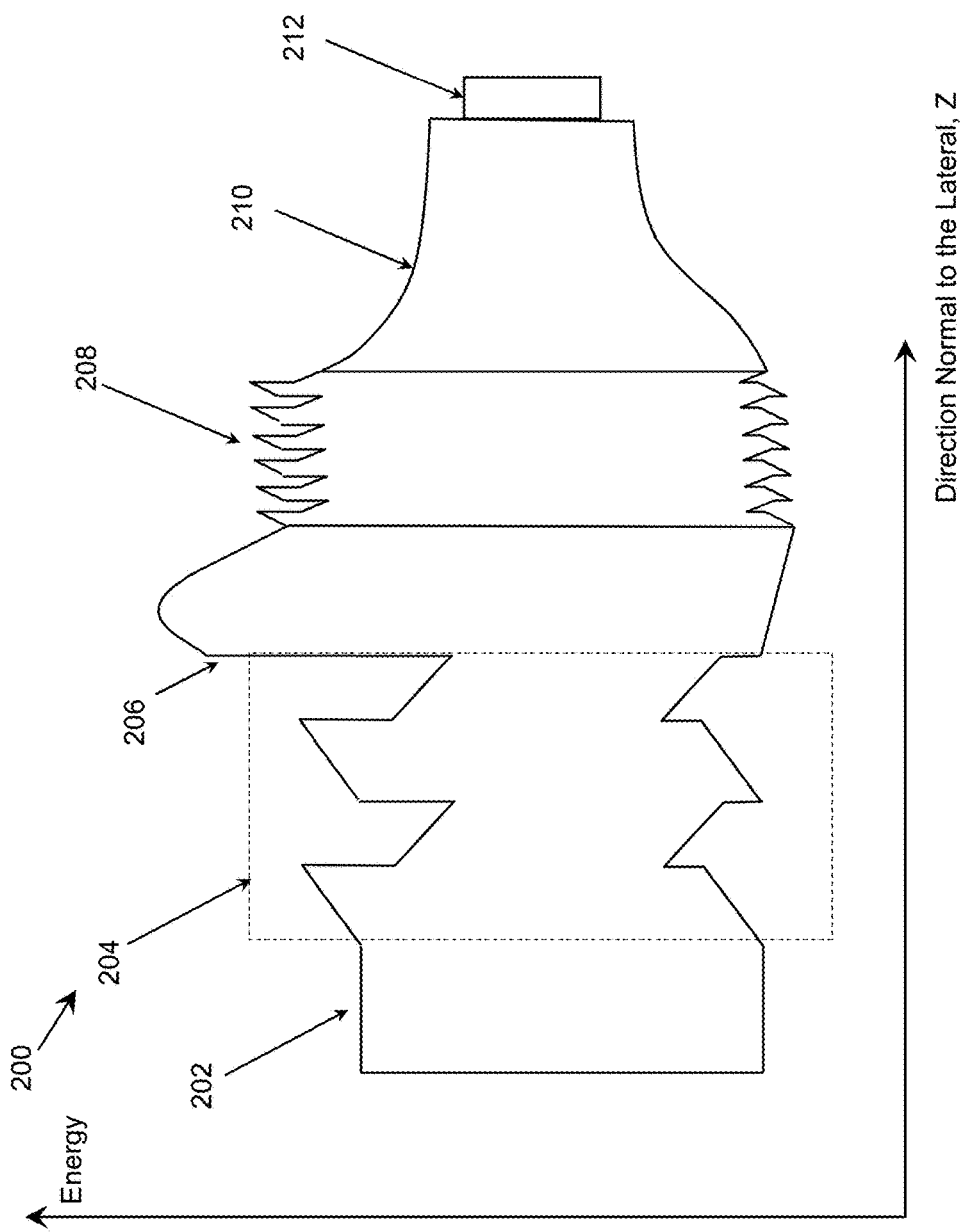

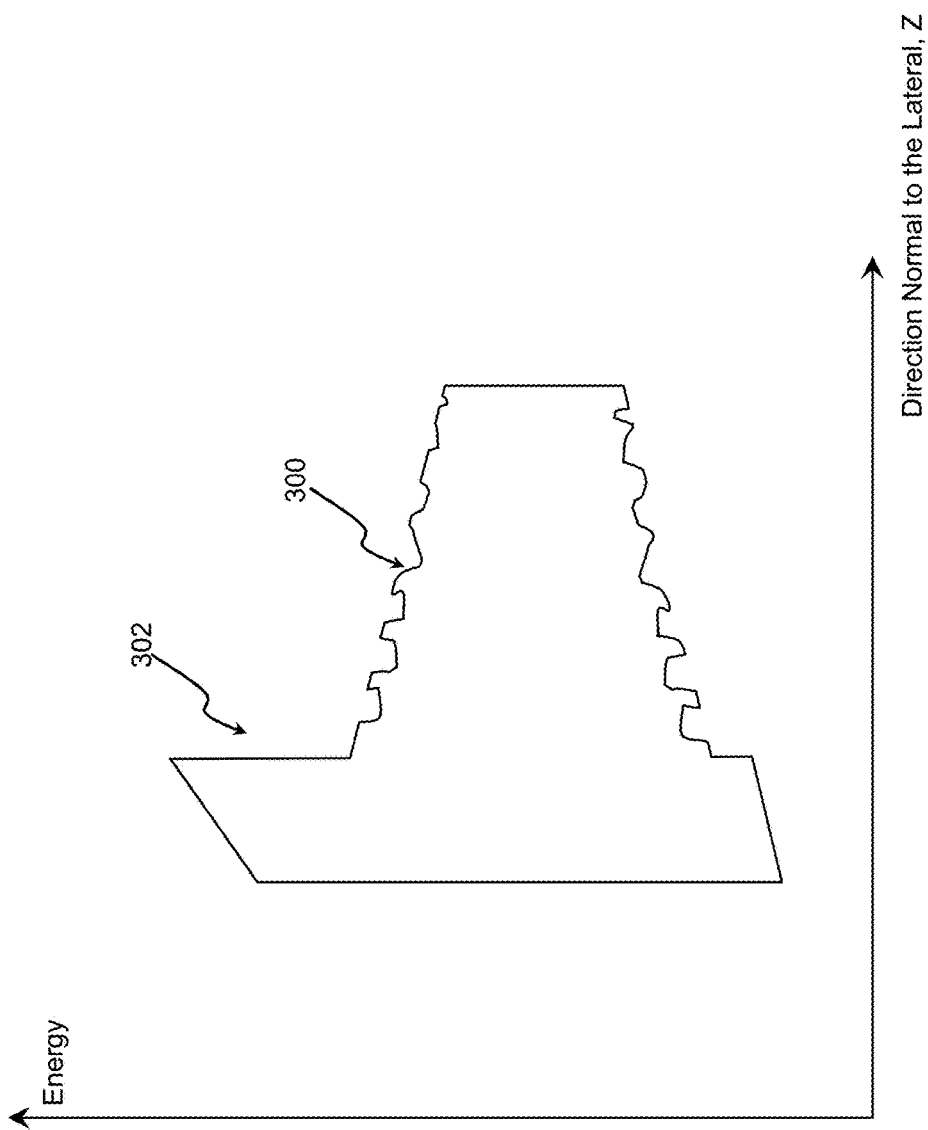

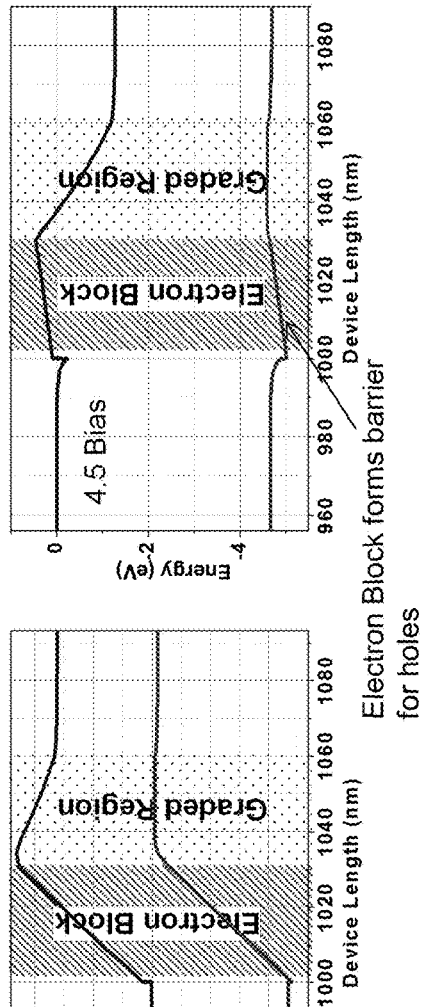
FIG. 13A
FIG. 13B
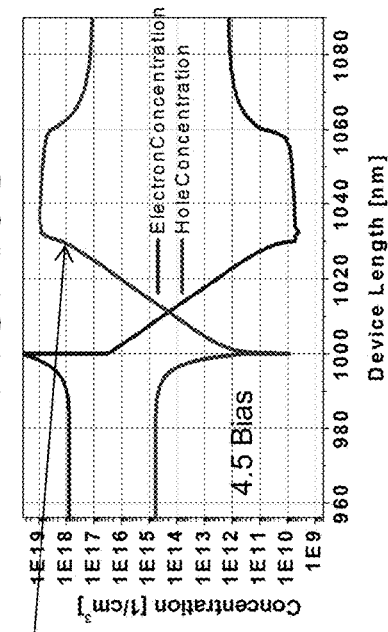
FIG. 13C
High concentration induced by grading
Current Density at 4.5V is: 0.35 A/cm²

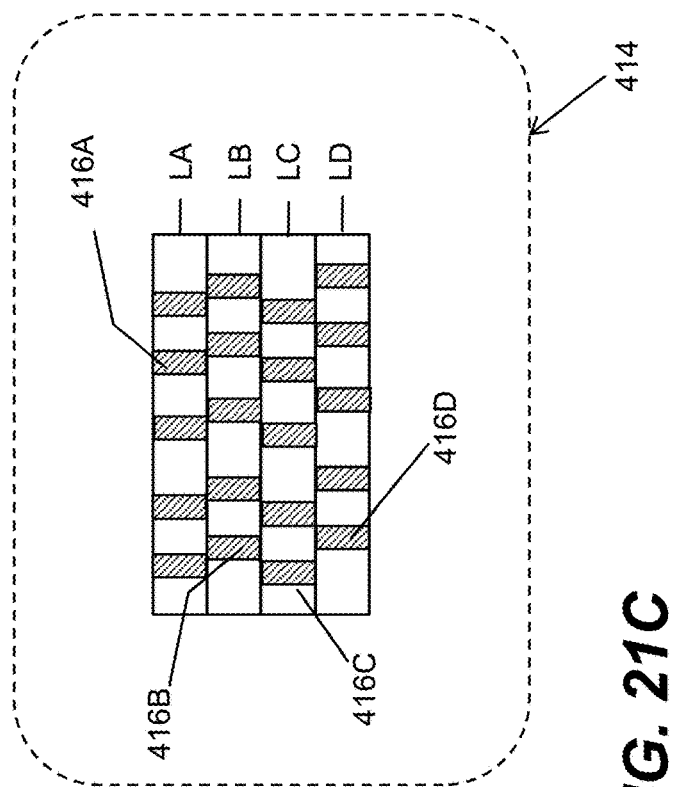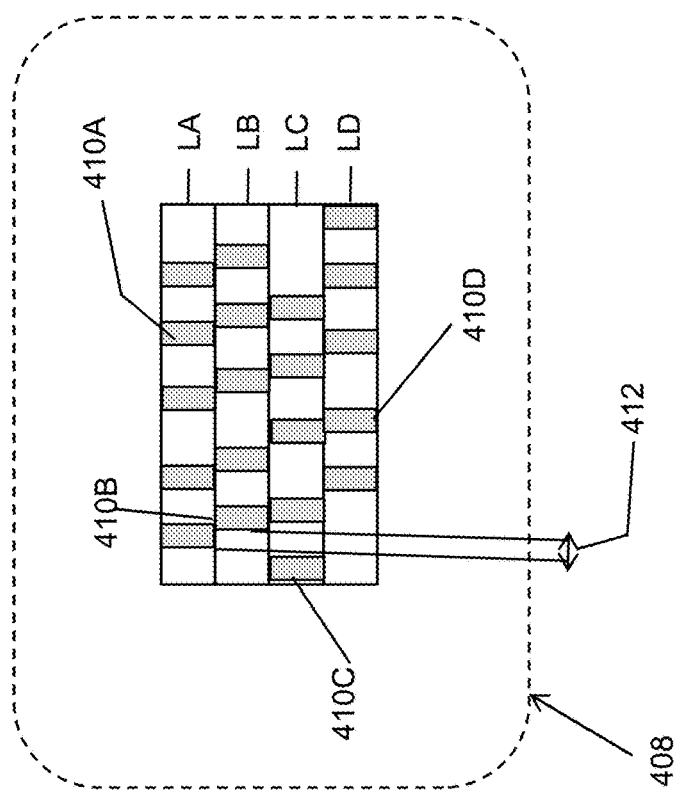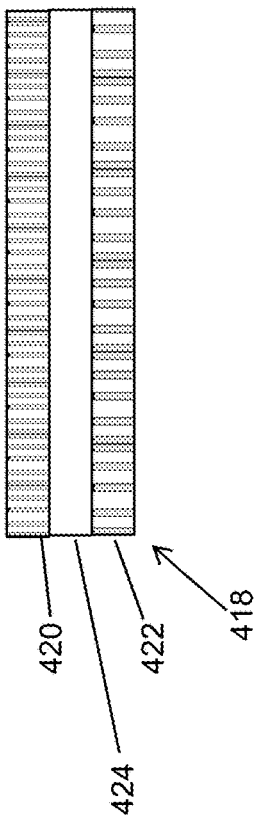
FIG. 21A
FIG. 21B
FIG. 21C

DEVICE WITH TRANSPARENT AND HIGHER CONDUCTIVE REGIONS IN LATERAL CROSS SECTION OF SEMICONDUCTOR LAYER

REFERENCE TO RELATED APPLICATIONS

The current application is a continuation of U.S. application Ser. No. 15/200,313, filed on 1 Jul. 2016, which is a continuation-in-part of U.S. application Ser. No. 14/721,082, filed on 26 May 2015, which claims the benefit of U.S. Provisional Application No. 62/090,101, filed on 10 Dec. 2014, and which is a continuation-in-part of U.S. application Ser. No. 14/531,162, filed on 3 Nov. 2014, which is a continuation of U.S. application Ser. No. 14/184,649, filed on 19 Feb. 2014, which claims the benefit of U.S. Provisional Application No. 61/768,692, filed on 25 Feb. 2013, and which is a continuation-in-part of U.S. application Ser. No. 13/572,446, filed on 10 Aug. 2012, which claims the benefit of U.S. Provisional Application No. 61/522,425, filed on 11 Aug. 2011, and U.S. Provisional Application No. 61/600,701, filed on 19 Feb. 2012, each of which is hereby incorporated by reference in its entirety to provide continuity of disclosure. Aspects of the invention are related to U.S. application Ser. No. 14/285,738, which was filed on 23 May 2014, and which is hereby incorporated by reference.

GOVERNMENT LICENSE RIGHTS

This invention was made with government support under contract no. W911NF-10-2-0023 awarded by the Defense Advanced Research Projects Agency (DARPA). The government has certain rights in the invention.

TECHNICAL FIELD

The disclosure relates generally to emitting devices, and more particularly, to an emitting device with improved efficiency.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride based LEDs and LDs can be of the form $In_yAl_xGa_{1-x-y}N$, where x and y indicate the molar fraction of a given element, $0 \leq x$, $y \leq 1$, and $0 \leq x+y \leq 1$. Other illustrative group III nitride based LEDs and LDs are based on boron (B) nitride (BN) and can be of the form $Ga_zIn_yAl_xB_{1-x-y-z}N$, where $0 \leq x, y, z \leq 1$, and $0 \leq x+y+z \leq 1$.

An LED is typically composed of semiconducting layers. During operation of the LED, an applied bias across doped layers leads to injection of electrons and holes into an active layer where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the electronic and optical properties of the layer. In particular, the refractive index and absorption characteristics of a layer are sensitive to the molar fractions of the semiconductor alloy. Variation of the molar fraction throughout a layer results in variation in the index of refraction and the band gap energy of the layer.

Ultraviolet LEDs are typically grown using group III-V semiconductor layers such as layers of $Al_xGa_{1-x}N$. It was found that the material properties of $Al_xGa_{1-x}N$ alloys change as the amount of aluminum in the alloy is increased. With proper growth conditions, it also was found that the aluminum did not incorporate uniformly throughout the AlGaN layer (i.e., the material has areas of high and low concentrations of aluminum spread throughout). These compositional fluctuations, together with doping fluctuations, also known as localized inhomogeneities, result in carrier localization and lead to the creation of conduction layers for carriers.

The effect of compositional fluctuations have been well studied for blue LEDs with pioneering work of S. Chichibu, T. Azuhata, T. Sota and S. Nakamura, Applied Physics Letters. 1997 May 1, 70, 2822; S. Chichibu, K. Wada, and S. Nakamura, Applied Physics Letters, vol. 71, pp. 2346-2348, October 1997, each of which is incorporated herein by reference in its entirety. The localization effect resulting from the creation of localized inhomogeneities has natural occurrence for InAlGaN alloys attributed to indium segregation. These effects have been reported in works of E. Monroy, N. Gogneau, F. Enjalbert, F. Fossard, D. Jalabert, E. Bellet-Amalric, Le Si Dang, and B. Daudin, J. Appl. Phys. 94, 3121 (2003); Mee-Yi Ryu, C. Q. Chen, E. Kuokstis, J. W. Yang, G. Simin, and M. Asif Khan, Appl. Phys. Lett. 80, 3730 (2002); H. Hirayama, A. Kinoshita, T. Yamabi, Y. Enomoto, A. Hirata, T. Araki, Y. Nanishi, and Y. Aoyagi, Appl. Phys. Lett. 80, 207 (2002); C. H. Chen, Y. F. Chen, Z. H. Lan, L. C. Chen, K. H. Chen, H. X. Jiang, and J. Y. Lin, Appl. Phys. Lett. 84, 1480 (2004), each of which is incorporated herein by reference in its entirety. Further, small additions of indium were shown to smooth out the band-bottom potential profile in AlInGaN layers owing to improved crystal quality. The effect of incorporation of 1% of indium to AlGaN semiconductor layer also has been studied. Similar to other studies, the creation of compositional inhomogeneities in a semiconductor layer with distinct double-scaled potential profile was observed, which indicates that indium atoms produce clusters of uniform consistency interspersed in AlGaN background semiconductor alloy.

During the growth process of AlGaN semiconductor layers, small islands with high aluminum content are formed. See A. Pinos, V. Liuolia, S. Marcinkevičius, J. Yang, R. Gaska, and M. S. Shur, Journal of Applied Physics, vol. 109, no. 11, p. 113516, 2011), which is incorporated herein by reference in its entirety. Grains with high aluminum content are separated by domain boundaries containing extended defects, which are formed in order to accommodate the relative difference in crystal orientation among the islands. These defects have high gallium content.

Details of compositional fluctuation in AlGaN semiconductors have been studied by photoluminescence (PL) measured using scanning near field optical microscopy (SNOM). Using this technique, the band gap fluctuations were observed to be of order of 50 meV. The fluctuations increase with higher aluminum content. For samples with low aluminum content (less than 0.4 molar fraction), the small-scale fluctuations occur within larger domains and are believed to be due to an inhomogeneous stress field and dislocations. For the aluminum molar fraction of 0.42 and higher, the small-scale potential variations were observed over the whole sample and assigned to the formation of Al-rich grains during the growth. Larger area potential variations of 25-40 meV, most clearly observed in the layers with a lower AlN molar fraction, have been attributed to Ga-rich regions close to grain boundaries or atomic layer steps. Analysis of the PL spectra allows evaluating average potential fluctuations due to inhomogeneous growth of AlGaN layers. Some findings suggest that there are two spatial scales of potential fluctuation—large scale of order of 1 μm and small scale that is less than 100 nm. Potential fluctuations reach amplitudes of few tens of meV at each scale.

FIG. 1 shows a schematic of compositional fluctuation according to the prior art. During the initial growth stage, adjacent small islands, from which the growth starts, coalesce into larger grains. As the islands enlarge, Ga adatoms, having a larger lateral mobility than Al adatoms, reach the island boundaries more rapidly, thus the Ga concentration in the coalescence regions is higher than in the center of the islands. The composition pattern, which is formed during the coalescence, is maintained as the growth proceeds vertically. As a result of the coalescence, the domain boundaries usually contain extended defects that form to accommodate the relative difference in crystal orientation among the islands. Even in layers with smooth surfaces containing elongated layer steps, screw/mixed dislocations occur due to the local compositional inhomogeneities.

High magnesium doping can lead to the creation of mini-bands originating from the discrete acceptor levels. A red shift in room temperature photoluminescence spectra has been observed giving an indication that miniband levels are emerging for acceptor concentration levels of the order of $n=10^{19}$-$10^{20}$ ($1/cm^3$). In high acceptor concentration domains, hole wavefunctions may overlap thus forming hole conduction pathways through the material. These pathways lead to an increase of conductivity through semiconductor layers.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

In light of the above, the inventors recognize that compositional and/or doping inhomogeneities allow for the development of conduction channels, e.g., in p-type superlattice layers. At the same time, the regions high in aluminum content allow for low light absorption (e.g., a higher transmission coefficient). The inventors propose to achieve a desired balance of higher conduction with reduced light absorption by tailoring semiconductor properties through the use of composite inhomogeneities, thereby obtaining a more optimal semiconductor material for light emitting/transmission applications.

Aspects of the invention provide a device including one or more layers with lateral regions configured to facilitate the transmission of radiation through the layer and lateral regions configured to facilitate current flow through the layer. The layer can comprise a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range.

A first aspect of the invention provides a device comprising: a short period superlattice (SPSL) semiconductor layer comprising a plurality of barriers, wherein a composition of at least one barrier varies along the lateral dimensions of the at least one barrier such that a lateral cross section of the at least one barrier includes: a set of transparent regions, each transparent region having a transmission coefficient for a target radiation wavelength, I, greater than or equal to approximately sixty percent, wherein the set of transparent regions are at least ten percent of an area of the lateral cross section of the at least one barrier; and a set of higher conductive regions occupying a sufficient area of the area of the lateral cross section of the at least one barrier and having an average resistance per unit area to a vertical current flow resulting in a total voltage drop across the SPSL of less than approximately five volts.

A second aspect of the invention provides a device comprising: a short period superlattice (SPSL) semiconductor layer comprising a plurality of barriers, wherein a lateral cross section of each barrier includes: a set of transparent regions, each transparent region having a transmission coefficient for a target radiation wavelength, I, greater than or equal to approximately sixty percent, wherein the set of transparent regions are at least ten percent of an area of the lateral cross section of the barrier; and a set of higher conductive regions occupying a sufficient area of the area of the lateral cross section of the barrier and having an average resistance per unit area to a vertical current flow resulting in a total voltage drop across the SPSL of less than approximately five volts.

A third aspect of the invention provides a method of fabricating a device comprising: forming a short period superlattice (SPSL) semiconductor layer comprising a plurality of barriers, wherein a lateral cross section of each barrier includes: a set of transparent regions, each transparent region having a transmission coefficient for a target radiation wavelength, I, greater than or equal to approximately sixty percent, wherein the set of transparent regions are at least ten percent of an area of the lateral cross section of the barrier; and a set of higher conductive regions occupying a sufficient area of the area of the lateral cross section of the barrier and having an average resistance per unit area to a vertical current flow resulting in a total voltage drop across the SPSL of less than approximately five volts.

A fourth aspect of the invention provides a device comprising: a short period superlattice (SPSL) semiconductor layer comprising a plurality of barriers, wherein a composition of at least one barrier varies along lateral dimensions of the at least one barrier such that a lateral cross section of the at least one barrier includes: a set of transparent regions having a first characteristic band gap, wherein the set of transparent regions are at least ten percent of an area of the lateral cross section of the at least one barrier; and a set of higher conductive regions having a second characteristic band gap at least five percent smaller than the first characteristic band gap, wherein the set of higher conductive regions occupies a sufficient area of the area of the lateral cross section of the at least one barrier to keep a voltage drop across the SPSL within a target range, and wherein lateral inhomogeneities in at least one of: the composition or a doping of the at least one barrier forms the set of transparent regions and the set of higher conductive regions.

A fifth aspect of the invention provides a device comprising: a short period superlattice (SPSL) semiconductor layer comprising a plurality of barriers, wherein a lateral cross section of each barrier includes: a set of transparent regions, wherein the set of transparent regions are at least ten percent of an area of the lateral cross section of the at least one barrier; and a set of higher conductive regions occupying a sufficient area of the area of the lateral cross section of the at least one barrier to keep a voltage drop across the SPSL within a target range, wherein a characteristic distance between two higher conductive regions in the set of higher conductive regions is less than a lateral current spreading length.

A sixth aspect of the invention provides a method of fabricating a device comprising: forming a short period superlattice (SPSL) semiconductor layer comprising a plurality of barriers, wherein a lateral cross section of each barrier includes: a set of transparent regions, wherein the set of transparent regions are at least ten percent of an area of the lateral cross section of the at least one barrier; and a set of higher conductive regions occupying a sufficient area of the area of the lateral cross section of the at least one barrier to keep a voltage drop across the SPSL within a target range, wherein a characteristic distance between two higher conductive regions in the set of higher conductive regions is less than a lateral current spreading length.

A seventh aspect of the invention provides a device comprising: a semiconductor layer comprising a set of group III nitride layers, wherein at least one of the group III nitride layers is an inhomogeneous layer comprising: a set of transparent regions having a first characteristic band gap, wherein the set of transparent regions are at least ten percent of an area of the lateral cross section of the inhomogeneous layer; and a set of higher conductive regions having a second characteristic band gap at least five percent smaller than the first characteristic band gap, wherein the set of higher conductive regions occupy at least two percent of the area of the lateral cross section of the inhomogeneous layer, and wherein lateral inhomogeneities in at least one of: a composition or a doping of the at least one of the group III nitride layers forms the set of transparent regions and the set of higher conductive regions.

An eighth aspect of the invention provides an emitting device comprising: an active region configured to generate electromagnetic radiation having a target wavelength; and a semiconductor layer comprising a set of group III nitride layers, wherein at least one of the group III nitride layers is an inhomogeneous layer comprising: a set of transparent regions having a first characteristic band gap, wherein the set of transparent regions are at least ten percent of an area of the lateral cross section of the inhomogeneous layer; and a set of higher conductive regions having a second characteristic band gap at least five percent smaller than the first characteristic band gap, wherein the set of higher conductive regions occupy at least two percent of the area of the lateral cross section of the inhomogeneous layer, and wherein lateral inhomogeneities in at least one of: a composition or a doping of the at least one of the group III nitride layers forms the set of transparent regions and the set of higher conductive regions.

A ninth aspect of the invention provides an emitting device comprising: an active region configured to generate electromagnetic radiation having a target wavelength; and a semiconductor layer comprising a set of group III nitride layers, wherein at least one of the group III nitride layers is an inhomogeneous $Al_xIn_yGa_{1-x-y}N$ layer comprising: a set of transparent regions having a first characteristic band gap, wherein the set of transparent regions are at least ten percent of an area of the lateral cross section of the inhomogeneous layer; and a set of higher conductive regions having a second characteristic band gap at least five percent smaller than the first characteristic band gap, wherein the set of higher conductive regions occupy at least two percent of the area of the lateral cross section of the inhomogeneous layer, and wherein lateral inhomogeneities in at least one of: a composition or a doping of the at least one of the group III nitride layers forms the set of transparent regions and the set of higher conductive regions.

A tenth aspect of the invention provides a device, comprising: a short period superlattice (SPSL) semiconductor layer comprising a plurality of barriers alternating with a plurality of quantum wells, wherein a concentration of at least one barrier and a concentration of at least one quantum well varies along lateral dimensions of the SPSL semiconductor layer to form a two-dimensional carrier gas, wherein a lateral cross section of the at least one barrier includes: a set of transparent regions, each transparent region having a transmission coefficient for a target radiation wavelength, I, greater than or equal to approximately sixty percent, wherein the set of transparent regions are at least ten percent of an area of the lateral cross section of the at least one barrier; and a set of higher conductive regions occupying a sufficient area of the area of the lateral cross section of the at least one barrier and having an average resistance per unit area to a vertical current flow resulting in a total voltage drop across the SPSL of less than approximately five volts.

An eleventh aspect of the invention provides a device, comprising: a short period superlattice (SPSL) semiconductor layer comprising a plurality of barriers, wherein a lateral cross section of each barrier includes: a set of transparent regions, each transparent region having a transmission coefficient for a target radiation wavelength, I, greater than or equal to approximately sixty percent, wherein the set of transparent regions are at least ten percent of an area of the lateral cross section of the barrier; and a set of higher conductive regions occupying a sufficient area of the area of the lateral cross section of the barrier and having an average resistance per unit area to a vertical current flow resulting in a total voltage drop across the SPSL of less than approximately five volts; wherein the set of transparent regions and the set of higher conductive regions are formed by a non-uniform compositional distribution along the barrier thickness and/or barrier thickness of each barrier.

A twelfth aspect of the invention provides a device, comprising: a semiconductor layer comprising a set of group III nitride layers, wherein each one of the group III nitride layers is an inhomogeneous layer comprising at least one of: a set of transparent regions having a first characteristic band gap, wherein the set of transparent regions are at least ten percent of an area of the lateral cross section of the inhomogeneous layer; and a set of higher conductive regions having a second characteristic band gap at least five percent smaller than the first characteristic band gap, wherein the set of higher conductive regions occupy at least two percent of the area of the lateral cross section of the inhomogeneous layer, wherein the set of transparent regions and the set of higher conductive regions are structured laterally along the inhomogeneous layer in a periodic distribution, wherein the set of transparent regions and the set of higher conductive regions are spatially phase-shifted in relation to a periodic distribution of a set corresponding transparent regions and a set of corresponding higher conductive regions in immediately adjacent layers.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 9A and 9B show band diagrams of portions of illustrative multiple quantum well structures according to embodiments.

FIG. 10A shows additional details of a hybrid structure/band diagram of an illustrative plane within a multiple quantum well structure of a device according to an embodiment, while

FIG. 11 shows the structure of an active and p-type layer according to an embodiment.

FIG. 12 shows the graded layer with compositional inhomogeneities according to an embodiment.

FIGS. 13A-13C show calculations for electron blocking and grading layer and a resultant polarization doping according to an embodiment.

FIGS. 21A-21C show examples of distributions of sets of transparent regions and sets of conductive regions within different layers of a semiconductor with the regions having periodic structures that are spatially-shifted between neighboring layers according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a device including one or more layers with lateral regions configured to facilitate the transmission of radiation through the layer and lateral regions configured to facilitate current flow through the layer. The layer can comprise a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range. As used herein, unless otherwise noted, the term "set" means one or more (i.e., at least one) and the phrase "any solution" means any now known or later developed solution.

Figure 1:
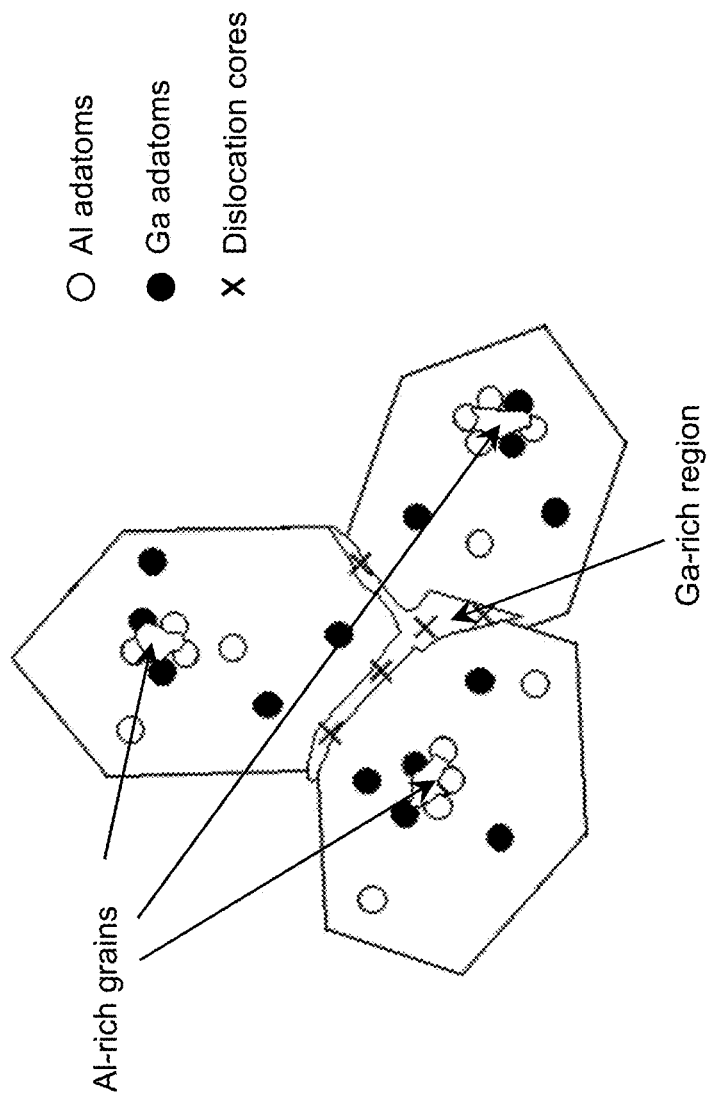
FIG. 1 shows a schematic of compositional fluctuation according to the prior art.
Figure 2:
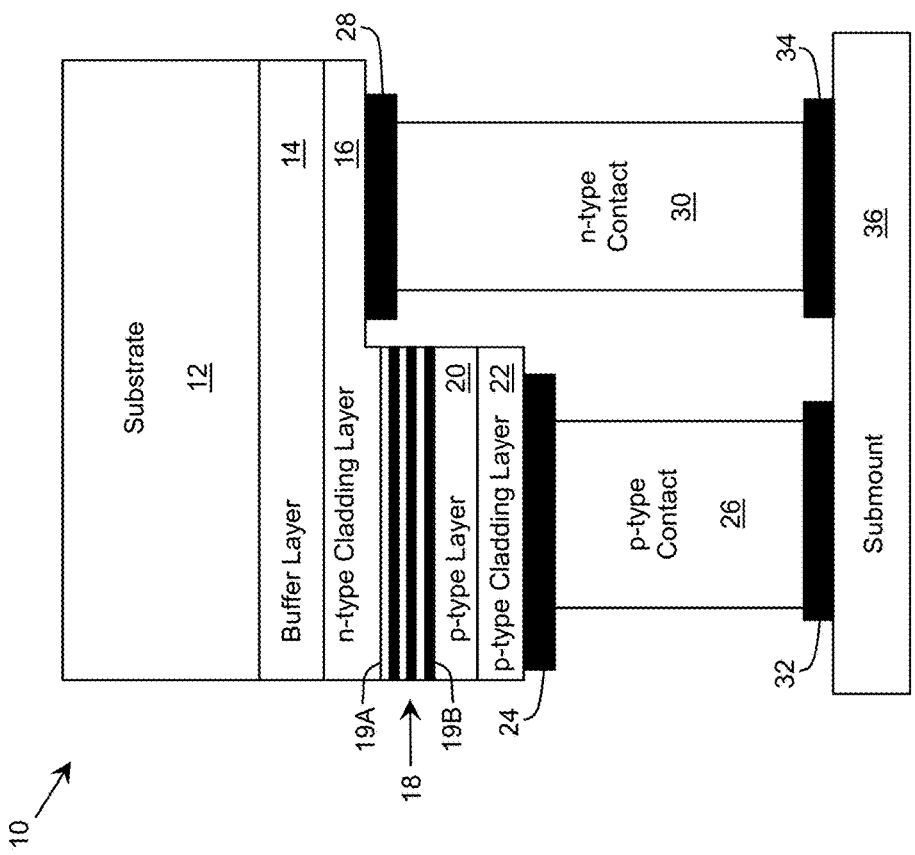
FIG. 2 shows a schematic structure of an illustrative emitting device according to an embodiment.

Turning to the drawings, FIG. 2 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like. In an embodiment, the device is configured to emit radiation having a dominant wavelength within the ultraviolet range of wavelengths. In a more specific embodiment, the dominant wavelength is within a range of wavelengths between approximately 210 and approximately 350 nanometers.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18. For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by the active region 18 (e.g., peak emission wavelength+/−five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the electron supply layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Regardless, as described herein, one or more of the semiconductor layers of the device 10 can comprise nanoscale and/or micron-scale localized compositional and/or doping inhomogeneities along the lateral dimensions of the device die. For example, a semiconductor layer can be p-doped with magnesium or n-doped with silicon to create the inhomogeneities. These inhomogeneities provide variation of band gap energy in a lateral direction of the layer, which results in a complicated energy landscape for a lateral cross section of the layer. In particular, the inhomogeneities will result in lower band gap regions, which become places of charge localization and form a set of higher conductive regions of carrier conductive channels in the semiconductor layer. These higher conductive regions have an improved vertical conductivity over that of a substantially homogenous layer of the material. Additionally, the inhomogeneities also will result in high band gap regions, which form a set of at least partially transparent regions within the layer, each of which has an improved vertical transparency over that of a substantially homogenous layer of the material.

Inclusion of the inhomogeneities in one or more of the semiconductor layers of the device 10 can result in an improvement in the efficiency of the device 10. The inhomogeneities can be included in any layer of the semiconductor device 10. To this extent, the inhomogeneities can be included in a superlattice region, a nucleation region, a buffer layer, a cladding layer, an active region, and/or the like of the device 10. In an embodiment, the inhomogeneities are incorporated into one or more injection layers, such as the n-type cladding layer 16, the p-type layer 20, the p-type cladding layer 22, the n-type contact 30, the p-type contact 26, and/or the like.

In an illustrative embodiment described further herein, the inhomogeneities are incorporated into a layer formed using a p-type superlattice, such as the p-type cladding layer 22. For example, the p-type cladding layer 22 can comprise a periodic structure composed of a set of barriers alternating with a set of wells. In a more specific embodiment, the sets of barriers and wells are each formed of a group III nitride material where each barrier comprises a higher aluminum content (molar fraction) than the adjacent well(s). In a still more specific embodiment, each barrier and well in the periodic structure can have a thickness less than approximately three nanometers. The p-type cladding layer 22 can be modulation p-doped with magnesium to incorporate the inhomogeneities. In an embodiment, the doping is such that a concentration of magnesium in the barrier regions is higher than $5 \cdot 10^{18}$ [$1/cm^3$] and a concentration of magnesium in the well regions is lower than $5 \cdot 10^{15}$ [$1/cm^3$].

In an alternative embodiment, a layer, such as the p-type cladding layer 22, can include a layer with compositional inhomogeneities. In this embodiment, the p-type cladding layer 22 can include a set of group III nitride material layers and at least one of the layers in the set of layers can include compositional inhomogeneities (e.g., higher or lower aluminum and/or indium content). This inhomogeneous layer (or group of inhomogeneous layers, if more than one layer include compositional inhomogeneities) can have a thickness of between approximately one to one hundred nanometers. The difference between an average bandgap for the inhomogeneous layer and an average bandgap for a remaining portion of the p-type cladding layer 22 is at least thermal energy. A characteristic size of the plurality of compositional inhomogeneous regions in the inhomogeneous layer can be smaller than an inverse of a dislocation density for the layer 22. In an embodiment, an inhomogeneous layer in the p-type cladding layer 22 can be immediately adjacent to the p-type metal 24. In this embodiment, the p-type metal 24 can be at least approximately thirty percent reflective. The plurality of compositional inhomogeneous regions in the inhomogeneous layer can include different lateral scales and can include nanoscale inhomogeneities. For example, at least a portion of the plurality of compositional inhomogeneous regions can include inhomogeneities that are from a few to a few hundred nanometers. In another example, at least a portion of the plurality of compositional inhomogeneous regions can include inhomogeneities that are large scale and on the order of a few microns.

Figure 3:
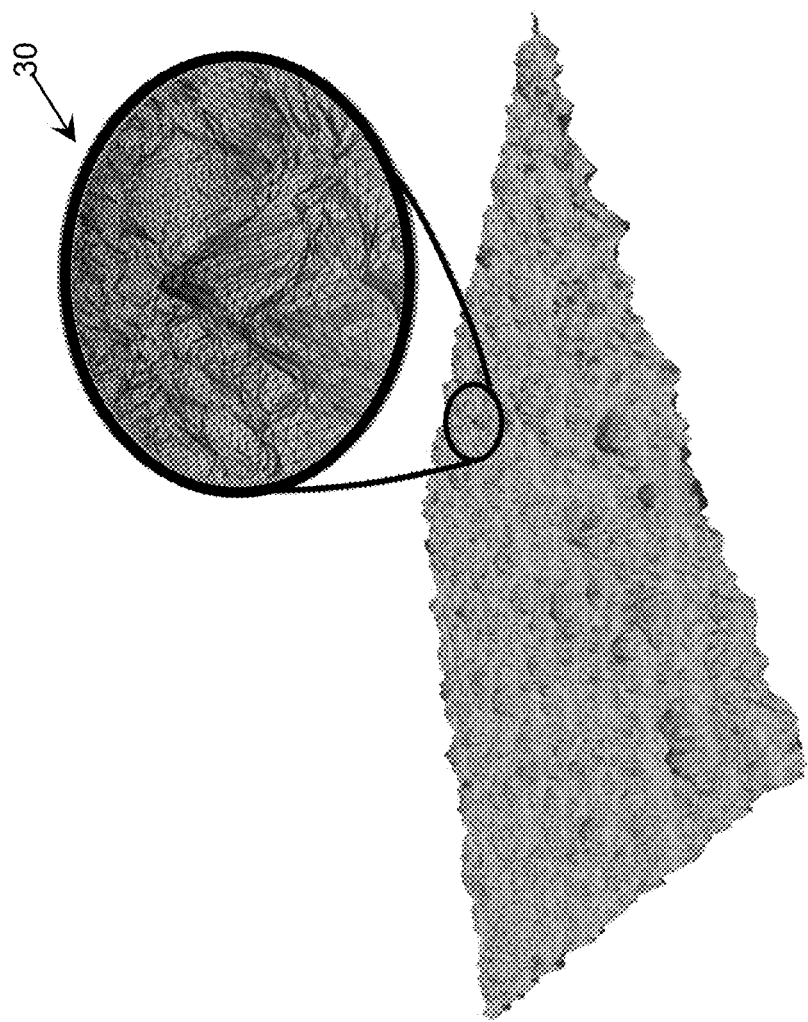
FIG. 3 shows an illustrative schematic representation of the variations of the conduction or valence band due to compositional inhomogeneities according to an embodiment.
Figure 4:
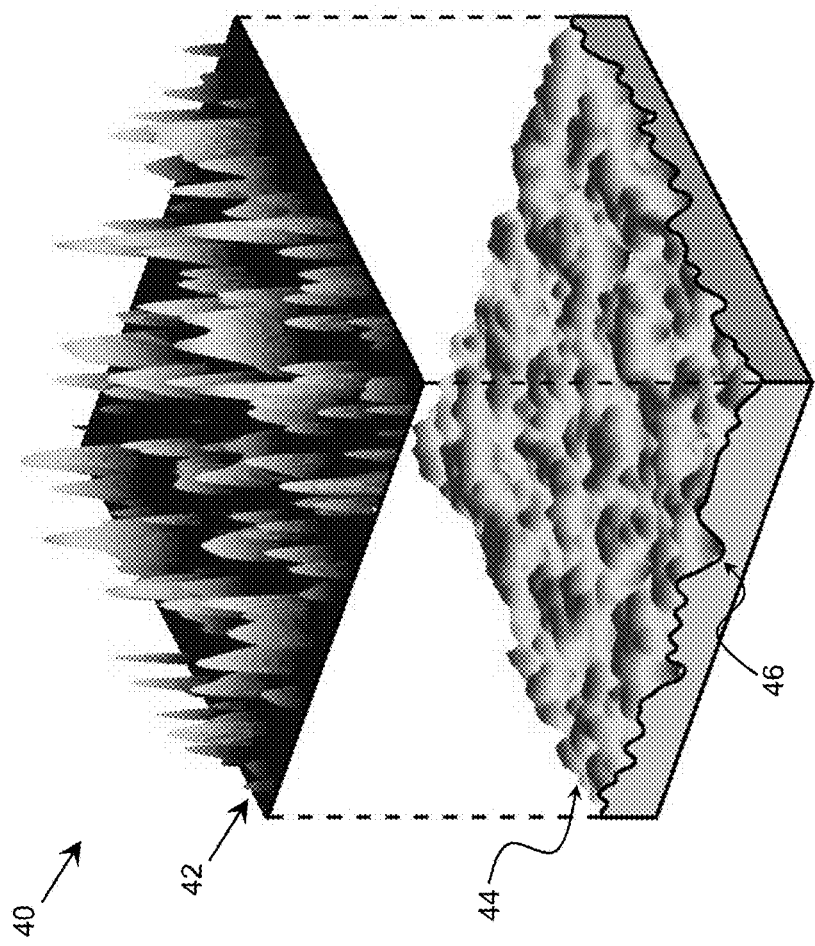
FIG. 4 shows an illustrative layer including domains with compositional inhomogeneities according to an embodiment.

FIG. 3 shows an illustrative schematic representation of variations of the conduction or valence band due to compositional inhomogeneities according to an embodiment. The variations are shown over a lateral area of the semiconductor layer in the zoomed in portion 30. These variations in the conduction or valence band can be due to variations in molar fractions of one or more elements in the lateral area of the layer. For example, the variations in the conduction or valence band can be due to lateral variations of aluminum nitride molar fractions, indium nitride molar fractions, both, and/or the like. The variations of aluminum (Al) and/or indium (In) within a semiconductor layer (e.g., p-type cladding layer 22 in FIG. 2) can be at different portions of the layer. For example, as seen in FIG. 4, for any given layer 40, a first domain 42 can include a variation of a molar fraction (e.g., variation in the molar fraction of In), while a second domain 44 includes a variation of another molar fraction (e.g., variation in the molar fraction of Al). The result of one or both of these variations in domains 42, 44 is a variation in the conduction or valence band 46.

Figure 5A:
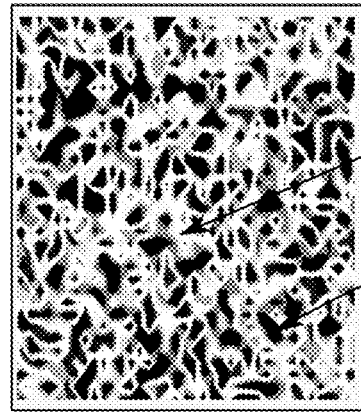
FIGS. 5A-5C show illustrative schematic representations of a p-type layer formed using a p-type superlattice according to an embodiment.
Figure 5B:
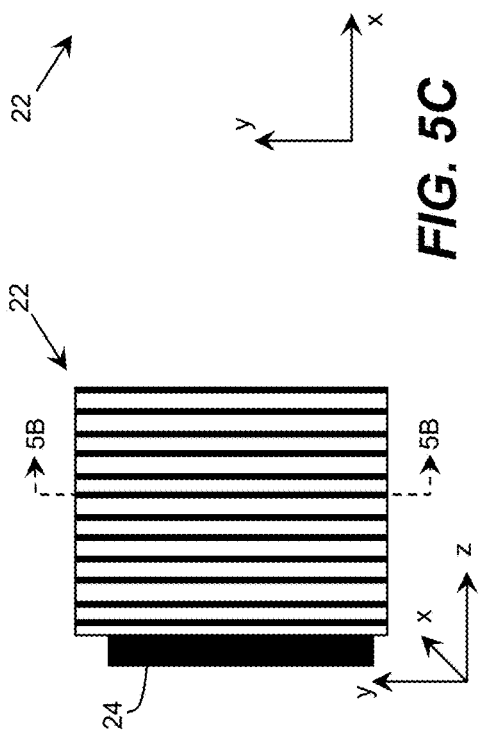
Figure 5C:
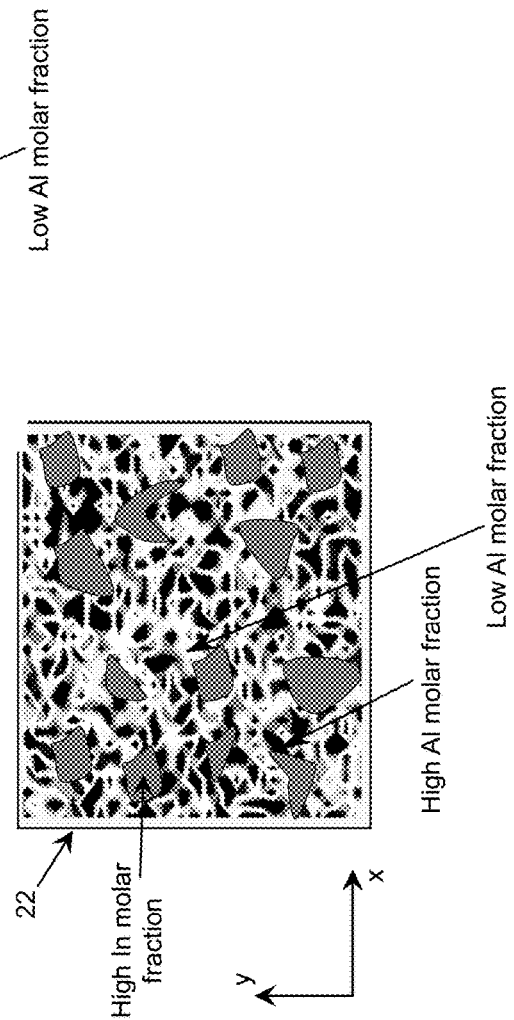

FIGS. 5A-5C show illustrative schematic representations of the p-type cladding layer 22 formed using a p-type superlattice according to an embodiment. In an another embodiment, the p-type cladding layer 22 can be formed by a single layer as described herein. The p-type cladding layer 22 is shown adjacent to the p-type metal 24. In FIGS. 5A-5C, areas with a high aluminum composition are indicated by the dark regions, while areas with a low aluminum composition are indicated by the lighter/bright regions. To this extent, FIG. 5A illustrates variation in aluminum composition within the layer 22 along the height of the layer (e.g., indicated by direction z) in a direction normal to a surface of the layer 22 adjacent to the p-type metal 24. In particular, if the p-type cladding layer 22 is formed using a p-type superlattice, the p-type cladding layer 22 can be formed of a p-type $Al_xGa_{1-x}N/Al_yGa_{1-y}N$ superlattice, where molar fractions x and y correspond to the molar fractions of barriers and wells, respectively, and where the molar fraction x is greater than the molar fraction y. Each barrier and well can be approximately a few nanometers in thickness. For example, the wells can have a thickness in a range between approximately one and approximately six nanometers, and the barriers can have a thickness in a range between approximately five and approximately twenty nanometers. In an embodiment, the superlattice of layer 22 includes compositional grading. In another embodiment, the layer 22 can include an aperiodic superlattice, where the period varies along with the compositional grading.

FIG. 5B illustrates variation in the aluminum composition of the p-type cladding layer 22 in the lateral directions (e.g., indicated by directions x and y) of the layer 22. FIG. 5B can correspond to a lateral cross section of the layer 22 taken along a barrier of the layer 22. As used herein, the term lateral means the plane of the layer 22 that is substantially parallel with the surface of the layer 22 adjacent to another layer of the device 10 (FIG. 2), such as the surface of the layer 22 adjacent to the p-type metal 24. As illustrated, the lateral cross section of the layer 22 includes a set of transparent regions, which correspond to those regions having a relatively high aluminum content, and a set of higher conductive regions, which correspond to those regions having a relatively low aluminum content.

In an alternative embodiment, the p-type cladding layer 22 can be a single layer that incorporates indium. FIG. 5C illustrates variation in the aluminum and indium composition of the p-type cladding layer 22 in the lateral directions (e.g., indicated by directions x and y) of the layer 22. Similar to FIG. 5B, FIG. 5C can correspond to a lateral cross section of the layer 22. The lateral cross section of the layer 22 can include a set of transparent regions (e.g., high aluminum content and low indium content) and a set of higher conductive regions (e.g., low aluminum content and higher indium content). The layer 22 can also include a set of regions comprising high indium content. In this embodiment, the inhomogeneities in the molar fraction of aluminum can be at a different scale than the inhomogeneities in the molar fraction of indium. Furthermore, the scale of the inhomogeneities of both aluminum and indium can depend on details of the growth conditions, such as growth temperature, ratio of the precursors, the V/III ratio of each precursor, and/or the like. The method of growth can incorporate pulsed growth where the flow of precursors is separated in time.

The set of transparent regions can be configured to allow a significant amount of the radiation to pass through the layer 22, while the set of higher conductive regions can be configured to keep the voltage drop across the layer 22 within a desired range (e.g., less than five volts). In an embodiment, the total voltage drop across the layer 22 is less than ten percent of the total voltage drop across the entire device. In an embodiment, the set of transparent regions occupy at least ten percent of the lateral area of the layer 22, while the set of higher conductive regions occupy at least approximately two percent (five percent in a more specific embodiment) of the lateral area of the layer 22. Furthermore, in an embodiment, a band gap of the higher conductive regions is at least five percent smaller than the band gap of the transparent regions. In a more particular embodiment, the transparent regions comprise a transmission coefficient for radiation of a target wavelength higher than approximately fifty percent (sixty percent in another embodiment and eighty percent in a still more particular embodiment), while the higher conductive regions have a resistance per unit area to vertical current flow that is smaller than approximately $10^{-2}$ ohm·cm². In an embodiment, the transparent regions can comprise a transmission coefficient for radiation of a target wavelength higher than the transmission coefficient of the conductive region by at least 20%. As used herein, the term transmission coefficient means the ratio of an amount of radiation exiting of the region to an amount of radiation entering the region.

The set of transparent regions can be configured to form a photonic crystal. The photonic crystal can be configured to reduce an amount of radiation that is absorbed in the layer 22 by dispersing the radiation. The photonic crystal can be configured to form a lattice with at least one characteristic size T1 and a photonic crystal lattice vector a, wherein, in an embodiment, the characteristic size T1 can be on the order of the target radiation wavelength. Additionally, the lattice vector a can be on the order of the target radiation wavelength. While various photonic crystal embodiments are possible, the most readily manufactured is a photonic crystal comprising hexagonally positioned cylindrical transparent regions. It is understood that the photonic crystal may be imperfect, comprise transparent regions of non-similar shapes varying in size by as much as a few hundred percent separated by a characteristic distance that can vary throughout the material by as much as several hundred percent. It is also understood that the set of transparent regions can be manufactured using any solution, including one or more of: patterning, masking, epitaxial overgrowth combined with techniques such as thermal evaporation, magnetron sputtering, ion-beam deposition, laser beam evaporation, and/or the like.

Figure 7:
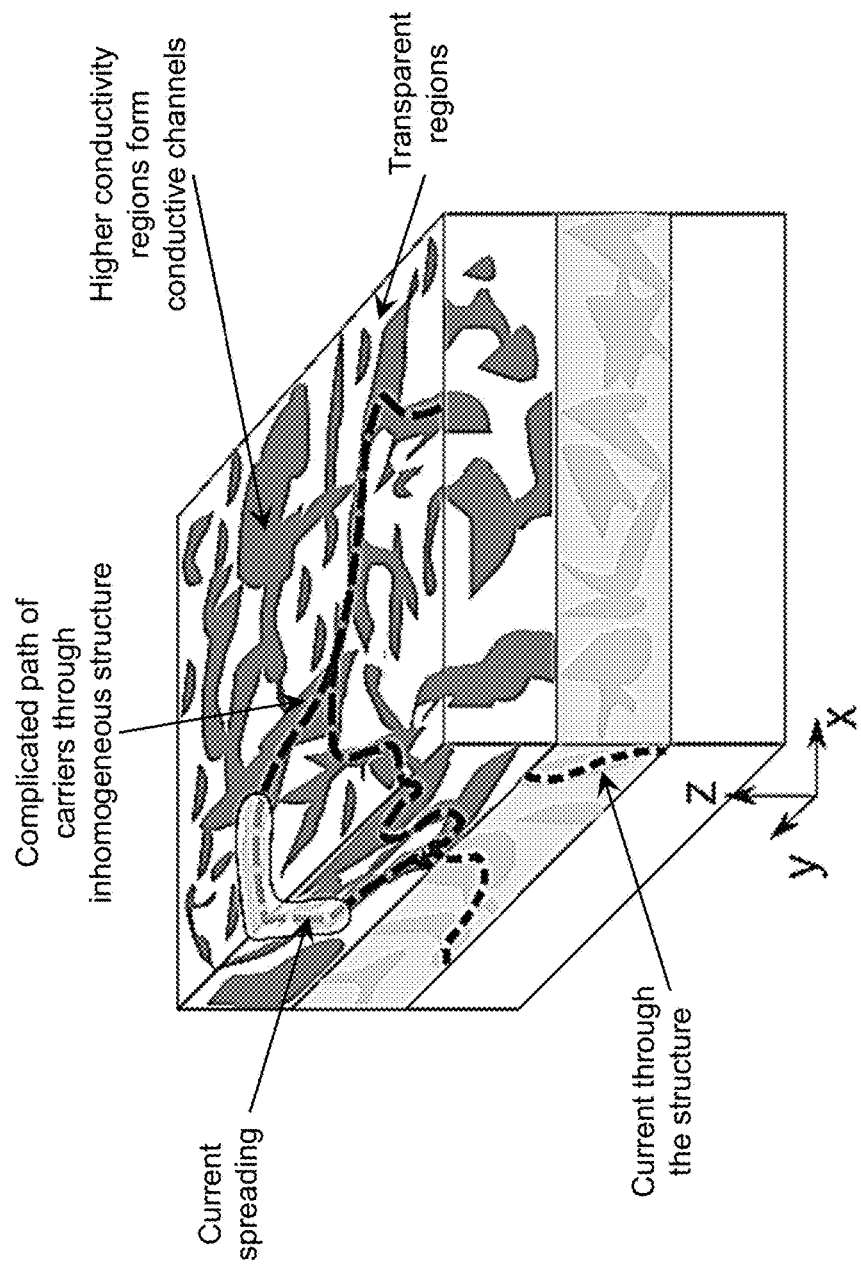
FIG. 7 shows a schematic representation of an illustrative carrier path in a complicated energy landscape caused by the inhomogeneities according to an embodiment.

The set of transparent regions can be interspersed with the set of higher conductive regions to form an interconnected network of conductive paths. FIG. 7 shows a schematic representation of an illustrative carrier path in a complicated energy landscape caused by the inhomogeneities according to an embodiment. As shown, the set of higher conductive regions (darker regions) are interspersed with the set of transparent regions (lighter regions) to form conductive channels for the interconnected network. The interconnected network of conductive paths allows for conductivity throughout the semiconductor layer (e.g., layer 22) containing the set of transparent regions. As used herein, the terms "interconnected network", "interconnected domain", or similar expressions describe domains including multiple smaller percolated regions, separated from each other by gaps. The percolated region size can be at least several lattice constants measured in the basal plane of the semiconductor lattice (e.g., group III nitride) and gaps can be at least two lattice constants measured in a basal plane. Alternatively, gaps can be steps between several basal planes. Further, a region (e.g., the set of higher conductive regions) is said to be percolated if, for any two atoms in the region, there is a conductive path connecting these atoms that lies entirely in the region.

The transparent and conductive regions can be formed using any solution. For example, the layer 22 can be grown using migration-enhanced metalorganic chemical vapor deposition (MEMOCVD). During the growth, inhomogeneities in the lateral direction of a molar fraction of one or more elements, such as aluminum, gallium, indium, boron, and/or the like, can be allowed of the layer 22. In an embodiment, such compositional inhomogeneities can vary by at least one percent.

Furthermore, in the embodiment of the layer 22 comprising a SPSL, the layer 22 can have a non-uniform distribution of a thickness of one or more of the barriers in the SPSL. The non-uniform distribution can be configured to create the transparent regions and the higher conductive regions. In an embodiment, the non-uniform distribution is accomplished by growing a film under a facetted or three-dimensional growth mode. This growth mode is achieved while growing under conditions where the growth rate of the film is determined by the arrival rate of active nitrogen (N-limited). Furthermore, this growth mode is achieved by growing under nearly stoichiometric conditions where the ratio of the arrival rate of group-III atoms (Al, Ga) and the arrival rate of active nitrogen is about unity. Moreover, the nanometer scale compositional inhomogeneities are self-assembled within the film as a result of such a growth mode.

In an embodiment, an illustrative process can be implemented to provide a growth mode for producing an $Al_xGa_{1-x}N$ alloy film, which can be utilized as a p-type layer in an emitting device. Such a growth mode can be defined by substrate temperature, a ratio of the group V/group III elements, doping concentration, and/or the like. For example, the substrate temperature can be between approximately 750 and approximately 1300 degrees Celsius. Additionally, an inhomogeneous distribution of aluminum can be obtained by controlling a density of screw dislocations present in the material. The density of the screw dislocations can be controlled, for example, by alternating the group V/group III element ratio in the inhomogeneous layer (e.g., the SPSL layers). The group V/group III element ratio can be in a range of ratios between approximately 20 and approximately 10000.

Still further, if the layer 22 is an SPSL layer, the growth of the layer 22 can allow a non-uniform compositional distribution along the barrier height and/or barrier thickness. Even further, when the layer 22 is doped, the growth of the layer 22 can allow a non-uniform doping distribution along the barrier height and/or barrier thickness. In another embodiment, if the layer 22 is a single layer, the growth of the layer 22 can still allow for non-uniform doping in addition to the non-uniform compositional distribution. For example, modulation doping of the layer 22 can be utilized to create a variation of acceptor concentration within the layer that exceeds approximately $1 \times 10^{18}$ $1/cm^3$.

In an embodiment, an SPSL layer described herein can be formed directly on an inhomogeneous layer (e.g., p-type layer 20 shown in FIG. 2), which can promote the SPSL semiconductor layer (e.g., layer 22 shown in FIG. 2) to form the transparent and conductive regions. In another embodiment, a layer containing the transparent and conductive regions described herein can be formed directly on a layer grown using a three-dimensional growth mode (e.g., a 3D layer, such as p-type layer 20 shown in FIG. 2). The 3D layer (e.g., p-type layer 20) can promote the layer containing the transparent and conductive regions (e.g., p-type cladding layer 22 in FIG. 2) to form the transparent and conductive regions. In either embodiment, the inhomogeneous layer and the 3D layer can be grown in a similar manner as the SPSL semiconductor layer or the layer containing the transparent and conductive regions, respectively, and also include transparent and conductive regions as described herein. However, the growth temperature of the inhomogeneous layer can be at least approximately two hundred degrees Celsius lower than the growth temperature used for growing the SPSL semiconductor layer and the layer containing the transparent and conductive regions. Furthermore, a thickness of the inhomogeneous layer and the 3D layer can be less than approximately 20 nanometers. In an embodiment, the growth of the inhomogeneous layer and the 3D layer can include: enabling the three dimensional (e.g., side and upward) coalescence of islands (e.g., of Al), which are grown at a temperature approximately two hundred degrees Celsius lower than the temperature used for growing the SPSL semiconductor layer; followed by two dimensional growth of the inhomogeneous layer around the islands using distinctly different growth conditions than during the formation of the islands. For example, the two dimensional growth can be at a temperature and/or a group V/group III element ratio comparable to that used for growing the SPSL semiconductor layer. The growth of islands followed by two dimensional growth can be repeated one or more times to form the inhomogeneous layer. While use of MEMOCVD is described herein, it is understood that growth of one or more of the layers can utilize another growth solution, such as metallo organic chemical vapor deposition (MOCVD), molecular beam epitaxy (MBE, as utilized in U.S. Pat. No. 7,812,366), and/or the like.

Figure 6:
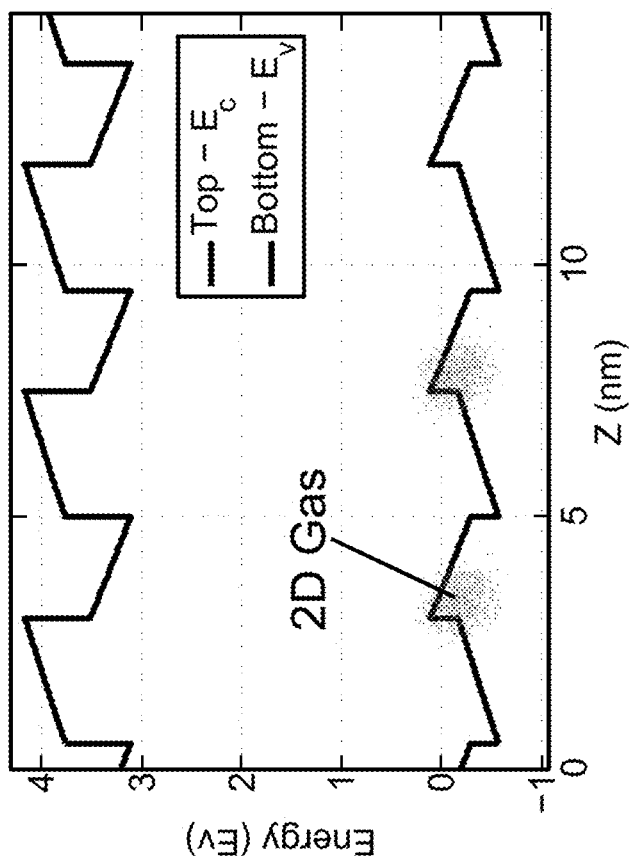
FIG. 6 shows an illustrative band variation for a p-type superlattice according to an embodiment.

FIG. 6 shows an illustrative band variation for a p-type superlattice, such as the layer 22 shown in FIGS. 5A-5C, according to an embodiment. Built in polarization fields result in the skewed band levels. The skewed band levels lead to the localization of carriers. For cases when doping is relatively small in the superlattice quantum wells, but relatively high in the barriers, acceptor ionization in the barriers is possible and can result in a large concentration of holes in the quantum wells, which leads to the formation of a two-dimensional carrier gas illustrated by the grey "clouded" regions of FIG. 6. In an embodiment, the quantum wells have a concentration less than $5 \cdot 10^{17}$ $[1/cm^3]$ (e.g., a concentration less than $5 \cdot 10^{15}$ $[1/cm^3]$), while the barriers have a concentration greater than $5 \cdot 10^{17}$ $[1/cm^3]$ (e.g., a concentration higher than $5 \cdot 10^{18}$ $[1/cm^3]$).

The carrier path through the layer 22 (FIGS. 5A-5C) is composed of a diffusive lateral component due to the high mobility of carriers in the lateral direction, barrier tunneling, and/or penetration through conducting channels in a direction normal to the semiconductor layer 22. FIG. 7 shows a schematic representation of an illustrative carrier path in a complicated energy landscape caused by the inhomogeneities according to an embodiment. As illustrated, the carrier path runs through the low energy valleys (e.g., higher conductivity regions) of the energy landscape (indicated by dark regions), and propagates through regions containing a high concentration of dopants. In these valleys and regions, the electrons and holes experience smaller energy barriers, which they can penetrate through using the low energy valleys. In an embodiment, a characteristic distance between the higher conducting regions is less than a lateral current spreading length within the layer. For example, the lateral current spreading length can be 0.1 μm or larger.

Figure 8:
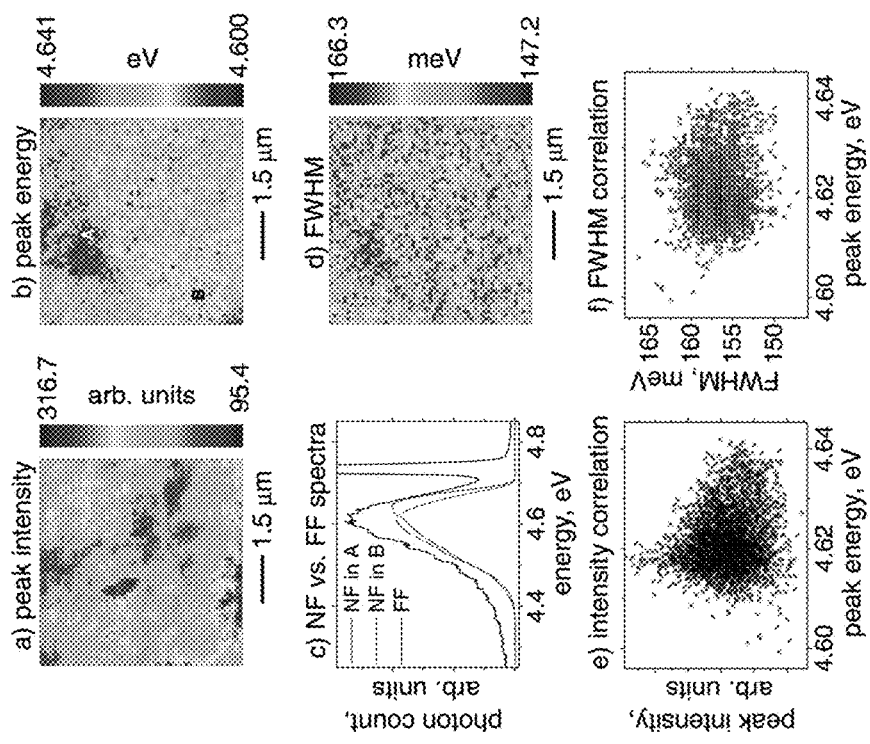
FIG. 8 shows illustrative maps corresponding to an $Al_{50}Ga_{50}N$ layer.

FIG. 8 shows illustrative maps corresponding to an $Al_{50}Ga_{50}N$ layer. In particular, FIG. 8 includes: a) a near-field photoluminescence map of the peak intensity; b) a near-field photoluminescence map of the peak energy; d) a near-field photoluminescence map of the full width at half maximum (FWHM); c) a map of near-field and far-field spectra; e) a map of intensity correlation; and f) a map of FWHM correlation. As illustrated, the emission is non-uniform throughout the active layer structure and includes high intensity red shifted regions, which are correlated to islands containing lower aluminum content than the surrounding area.

In another embodiment, a distribution of the compositional inhomogeneous regions can be graded across a layer. For example, a depth of the energy level across a layer including the compositional inhomogeneous regions can increase or decrease from an area proximate to a first semiconductor layer to an area proximate to a second semiconductor layer. In an embodiment, the inhomogeneous layer can be graded such that there is no band gap discontinuity at the interfaces of the inhomogeneous layer and the semiconductor layers adjacent to the inhomogeneous layer. Turning now to FIGS. 9A and 9B, illustrative band diagrams for a layer 40 including compositional inhomogeneous regions are shown. In FIG. 9A, the distribution of compositional inhomogeneous regions is graded so that the energy depth decreases towards a first semiconductor layer 42. In FIG. 9B, the distribution of compositional inhomogeneous regions is graded so that the energy depth increases towards the first semiconductor layer 42. The grading can be designed to improve electron-hole wave function overlap, which promotes the electron-hole radiative recombination. In an embodiment, the grading can be selected to offset the changes in the band gap due to the presence of spontaneous and piezoelectric polarization, which can be as much as approximately one electron volt. In another embodiment, the length scale of the inhomogeneity can change across the layer. For example, in FIG. 9B, the compositional inhomogeneous regions 44A immediately adjacent to the first semiconductor layer 42 are relatively larger than the compositional inhomogeneous regions 44B farthest away from the first semiconductor layer 42. In an embodiment, the length scale of compositional inhomogeneous regions 44A can be as much as several micrometers on the first side of the semiconductor layer and few nanometers on the second side of the semiconductor layer 42. The distance scale between the inhomogeneities on the first side of the semiconductor layer 42 can also be substantially different from the distance scale between the inhomogeneities on the second semiconductor layer 42. The change in the length scale from the first to second side of the semiconductor layer 42 allows for a different amount of electron-hole localization and improved radiative recombination of electron-hole pairs. For example, the first side of the semiconductor layer 42 can have characteristic distance between inhomogeneities that are on the order of few microns. The second side of the semiconductor layer 42 can have a characteristic distance of only few nanometers.

Figure 10B:
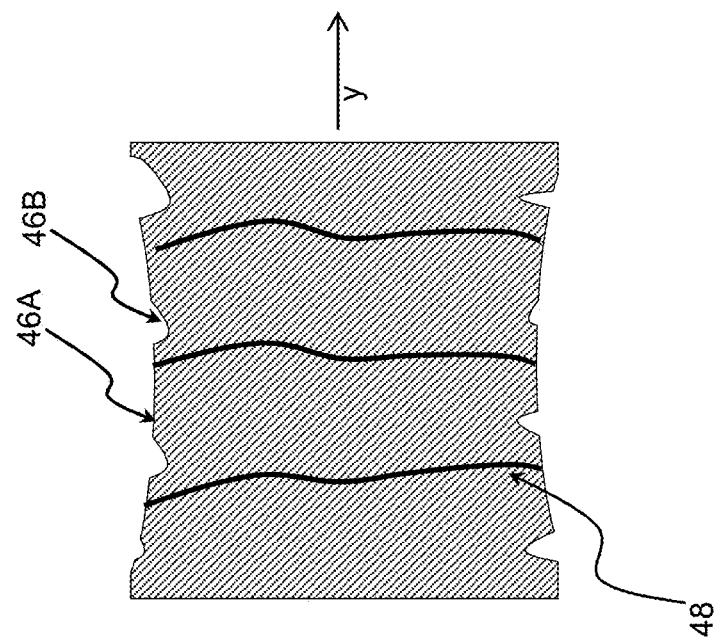
FIG. 10B shows an illustrative band gap map for the plane as a function of the y-axis according to an embodiment.
Figure 10A:
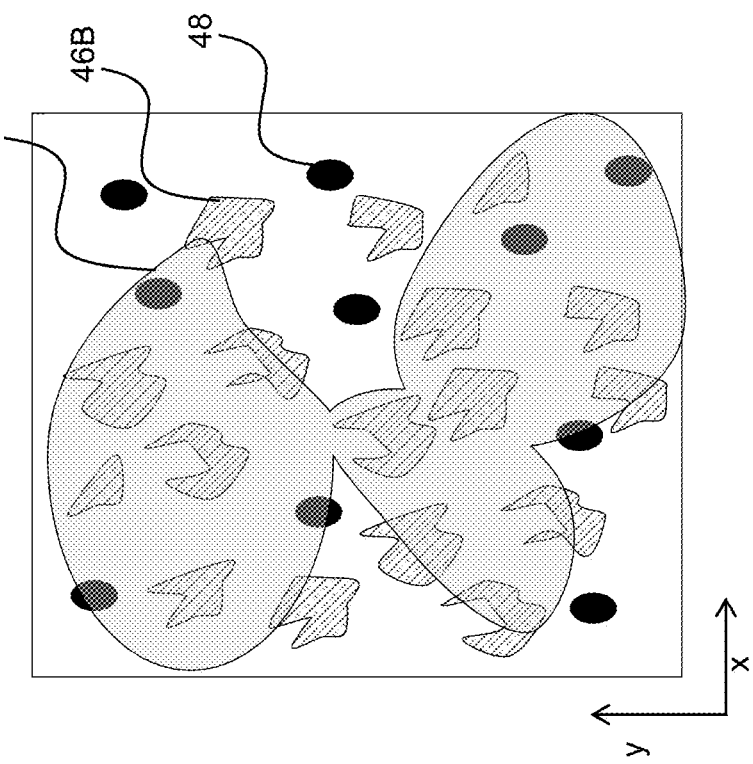

In an embodiment shown in FIG. 10A, a semiconductor layer can include both large and small scale compositional inhomogeneous regions (which can be achieved, for example, by varying conditions of the epitaxial growth). The large scale compositional inhomogeneous regions 46A can have large lateral areas of inhomogeneous regions. For example, the lateral area for the large scale compositional inhomogeneous regions 46A can be configured to be larger than the square of the characteristic distance between the threading dislocations 48 (which can be achieved, for example, by varying conditions of the epitaxial growth). An energy depth of the large scale compositional inhomogeneous regions 46A can be on the order of one thermal energy or more. The large scale compositional inhomogeneous regions 46A can allow for an efficient capture of the carriers, relative localization of the carriers within the large energy valleys (e.g., 46A in the band gap map of FIG. 10B), and/or the like. Subsequent localization of carriers can be due to capture at the small scale compositional inhomogeneous regions 46B. The small scale compositional inhomogeneous regions 46B also can have a depth on the order of one thermal energy or more. The small scale compositional inhomogeneous regions 46B have a lateral area that is smaller than the square of the characteristic distance between the threading dislocations 48. The small scale compositional inhomogeneous regions 46B allow for capturing the carriers before the carriers are captured by the threading dislocations 48.

Turning now to FIG. 11, an illustrative energy plot for a structure 200 containing a n-type cladding layer 202, an active layer 204, an electron blocking layer 206 graded into a SPSL 208, a p-type contact layer 210 that is shown to have a graded composition, which results in narrowing of a band gap, and a narrow band gap region 212. The narrow band gap region 212 can comprise a material with an overall bandgap that is smaller than the typical band gap of the p-type layer 210, such as GaN, InGaN, InAlGaN, and/or the like. Furthermore, the narrow band gap region 212 can comprise a set of layers with at least one layer having inhomogeneities that result in the presence of transparent and conductive regions, as described herein. In an embodiment, such a layer (e.g., narrow band gap region 212) can contain In and be heavily doped with p-type dopants, such as Mg, and/or the like. In another embodiment, the narrow band gap region 212 can contain highly doped p-type (e.g., p++ doping) GaN, which results in a p++ layer with a dopant concentration of at least approximately $4 \times 10^{19}$ dopants per cubic centimeter. Turning now to FIG. 12, a p-type layer 300 can be graded away from an electron blocking layer 302. The p-type layer 300 can include the compositional inhomogeneous regions and also include a layer containing the transparent and conductive regions described herein.

Figure 14A:
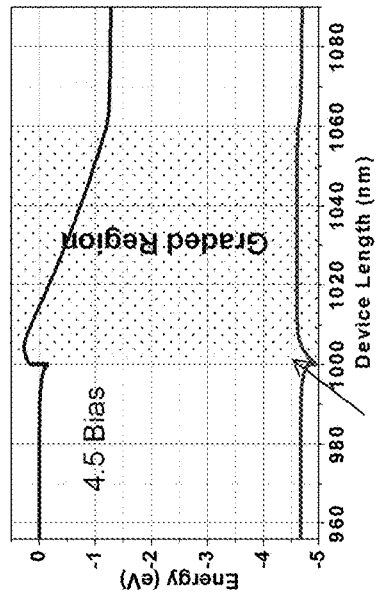
FIGS. 14A-14C show calculations for a grading layer and a resultant polarization doping according to an embodiment.
Figure 14B:
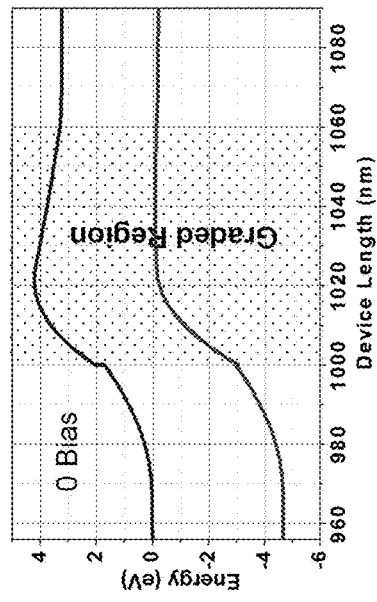
Figure 14C:
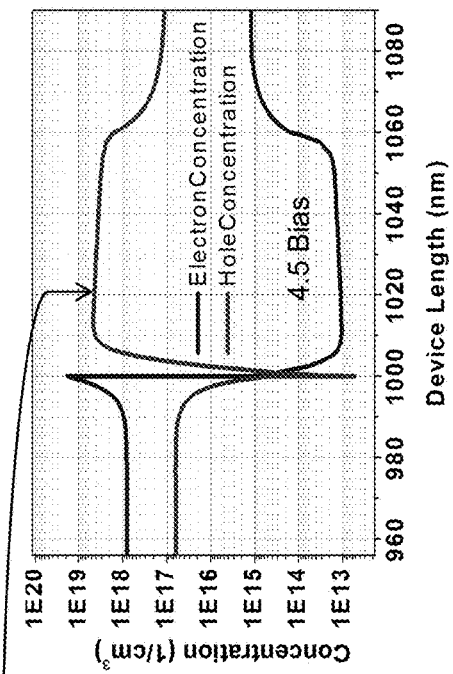

When semiconductors are graded from the electron blocking layer to the p-type layer, polarization doping can occur. FIGS. 13A-13C illustrate studies of the polarization doping that results from such grading. In FIG. 13A, under zero bias, a p-n diode is simulated to evaluate the magnitude of polarization doping. The electron blocking layer is graded to the p-type layer, as shown in FIG. 13A. In an embodiment, the electron blocking layer is either undoped or weakly doped with Mg and the Mg doping is at most approximately ten percent of the Mg doping in the p-type layer. Under an applied forward bias (e.g. 4.5 eV), the structure of the p-n diode changes, as shown in FIG. 13B. In FIG. 13C, the concentration of holes increase significantly (from approximately $10^{17}$ to approximately $10^{19}$ 1/cm$^3$) using a sharp grading. This is a change in composition over a short distance along the device length (e.g., the distance from the n-cladding layer to the p-cladding layer along the layer thickness). In the example shown in FIGS. 13A-13C, the grading is performed over a distance of approximately 20 nanometers (nm). FIGS. 14A-14C illustrate a slightly different embodiment where the entire electron blocking layer is graded and the grading is spread out over a larger thickness (approximately 60 nm). The resultant polarization doping is correspondingly smaller due to a smoother grading and the maximum doping is approximately $3 \times 10^{18}$ 1/cm$^3$. While the polarization doping may be lower in the case shown in FIG. 14C, the barrier layer associated with the electron blocking layer is smaller as well. This results in a higher transmission of holes over the barrier.

A theoretical basis for the devices described herein is included for clarity. However, it is understood that the invention is not limited to the inventor's current understanding of the benefits described herein or the basis for such benefits.

The overall wall plug efficiency of a light emitting device, such as device 10 (FIG. 2), is related to tradeoffs associated with the conductivity and the transparent characteristics of the semiconductor layers. In particular, the p-type cladding layer(s) can have a low conductivity and highest absorption coefficient compared to all other layers in a deep ultraviolet LED. Consider the total resistance of the device 10 as a sum of a resistance due to p-type cladding layer(s) ($R_p$) and a resistance due to all other components of the device 10, such as the resistances of the active region 18, n-type cladding layer 16, the contact resistances, and/or the like ($R_r$). The total voltage ($V_T$) across the device 10 is given by:

$$V_T = V_{on} + I(R_r + R_p)$$

with $V_{on}$ being a turn on voltage and I being the current. The total power dissipated ($P_{dis}$) on a device 10 is:

$$P_{dis} = IV_T = I^2(R_p + R_r) + IV_{on}$$

A device 10, such as a light emitting diode, described herein can operate at a set current I. Furthermore, assume that $R_r$ is fixed and known. The resistivity of a p-type contact layer, $R_p$, can be written as:

$$\frac{1}{R_p} = \frac{1}{R_1} + \frac{1}{R_2}$$

Here, $R_1$ is a portion of the p-type layer, such as superlattice (PSL) 22 (FIGS. 5A-5C), with a relatively low resistance and a relatively low transparency, while $R_2$ is a part of the PSL lattice with a relatively high resistance and a relatively high transparency. For cases when $R_1 \ll R_2$, it is sufficient to approximate $R_p \sim R_1$. This simple model assumes that most of the conduction in the p-type layer 22 happens through channels, which are connected domains with a lower concentration of aluminum, a higher concentration of indium, and a higher concentration of dopants. Regions of the layer 22 with a low resistance can be described by their characteristic resistivity $\rho_1$, as well as the gross cross sectional area that corresponds to these regions (further denoted as $A_1$); thus:

$$R_1=\rho_1 L_{HL}/A_1.$$

Here $L_{HL}$ denotes the corresponding length of the layer. Using $f=A_1/A$, where A is a total area of a device, then:

$$R_1=[(\rho_1 L_{HL})/A] \, (1/f)=R_0/f.$$

As a simple approximation, the resistance $R_0$ can be taken to be the resistance of a p-type contact layer composed of a characteristic semiconductor material, such as GaN or InGaN having a characteristic high p-doping (e.g., approximately $10^{19}$ dopants per cubic centimeter).

Figure 15:
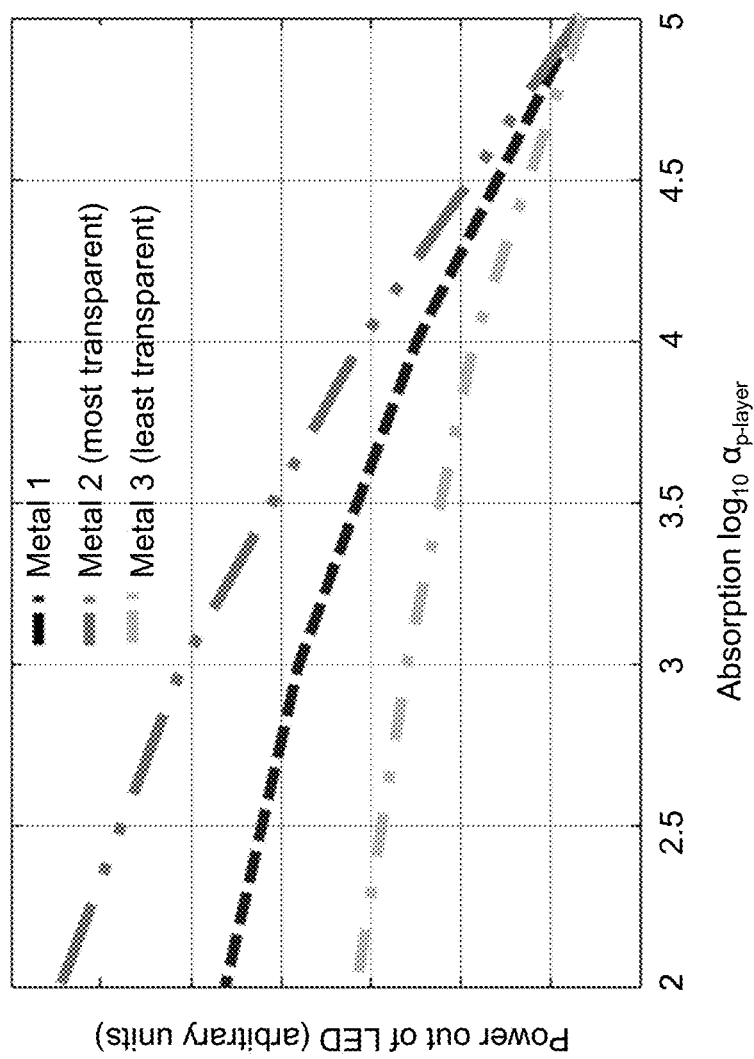
FIG. 15 shows the effect of the absorption coefficient of a p-type superlattice layer on the total extracted light from an illustrative light emitting diode structure according to an embodiment.
Figure 16:
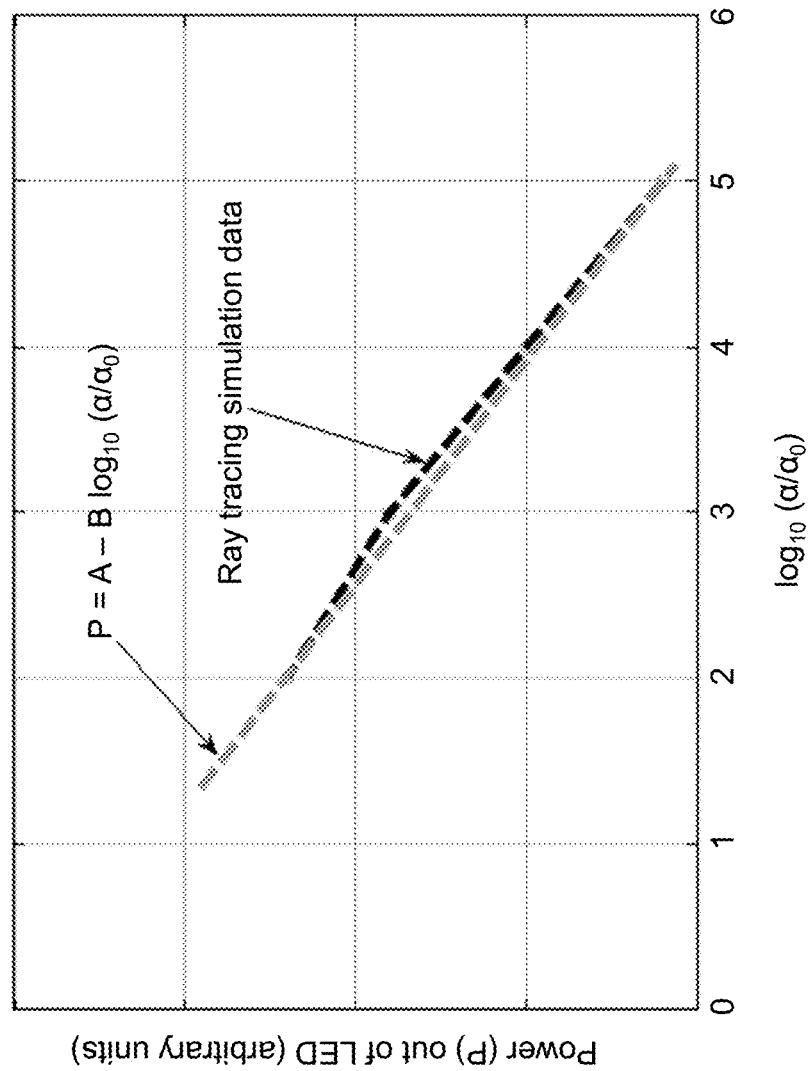
FIG. 16 shows a numerical fit to the ray tracing data shown in FIG. 7 according to an embodiment.

FIG. 15 shows the effect of the absorption coefficient of the layer 22 (e.g., a p-type superlattice) on the total extracted light from an illustrative light emitting diode structure according to an embodiment. The effect is shown in the context of a deep ultraviolet LED, and was obtained through ray tracing simulations. As illustrated, the total radiative power of the LED depends roughly linearly on $\log_{10}(\alpha/\alpha_0)$, with $\alpha_0$ being a normalization parameter. FIG. 16 shows a numerical fit to the ray tracing data according to an embodiment. Radiative power is then written as:

$$P_{out}=A-B \, \log_{10}(\alpha/\alpha_0)$$

where A, and B are fitting constants.

The transmittance of a layer is related to the absorption coefficient and the p-type cladding layer as:

$$T=T_0 \exp(-\alpha L_{PSL})$$

If a part of the area of a p-type cladding layer is not substantially transparent but is more conductive (this area is $A_1$), then the total transmission is given by (under an assumption of a uniform light flux per unit area):

$$T_{tot} = T\left(1 - \frac{A_1}{A}\right) = T(1-f) = T_0 \exp(-\alpha' L_{HL})$$

Here $\alpha'$ is a modification of the absorption coefficient due to area $A_1$ not being transparent. From this it follows that:

$$\exp(-\alpha L_{HL})(1-f)=\exp(-\alpha' L_{HL}) \text{ or } \alpha'=\alpha-\log(1-f)/L_{HL}$$

Using the expression for $P_{out}$, with $\alpha'=\alpha'(f;\alpha)$: $P_{out}=A-B \log_{10}(\alpha'/\alpha_0)$ and we can calculate the wall plug efficiency as:

$$WPE(f)=P_{out}(f)/P_{dis}(f).$$

Figure 17:
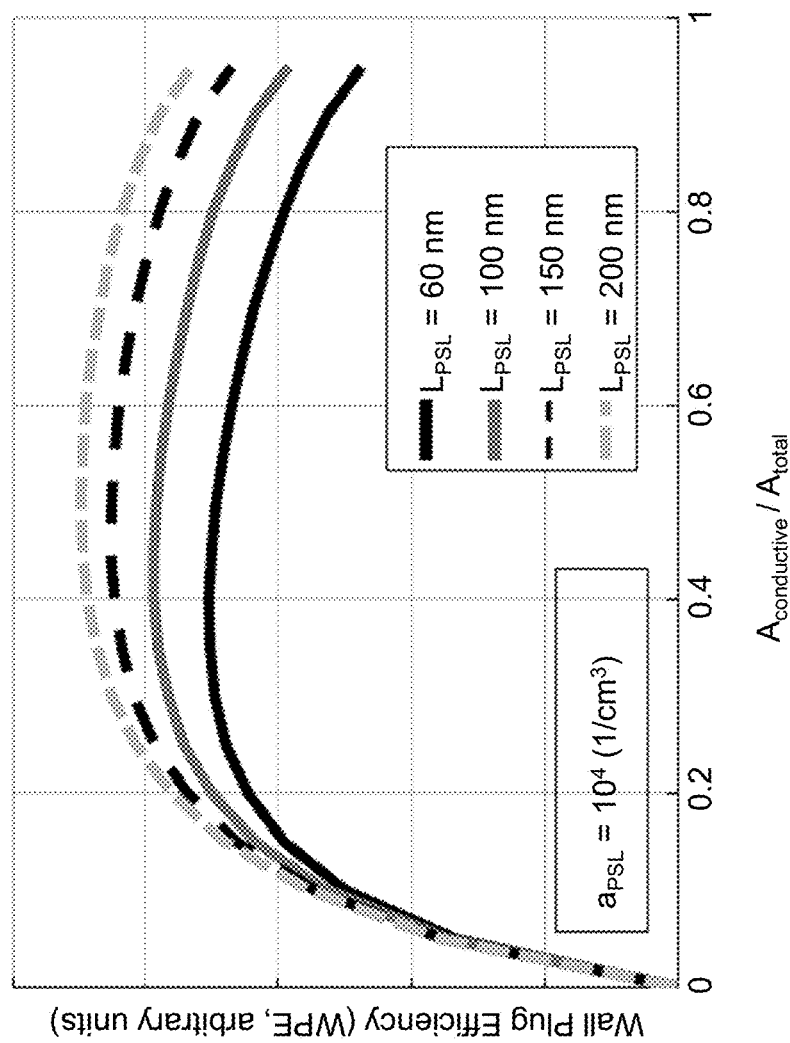
FIG. 17 shows a plot of the wall plug efficiency as a function of the conductance area fraction for typical light emitting diode materials according to an embodiment.

Wall plug efficiency can have a maximum for a particular value of f and can depend on the resistivity of the device, a thickness of the PSL, and the absorption coefficient $\alpha$. FIG. 17 shows a plot of the WPE as a function of the conductance area fraction, f, for typical LED materials according to an embodiment. As illustrated, a peak wall plug efficiency is obtained at a value of the conductance area fraction f between approximately 0.3 and 0.6. In an embodiment, a total area of the set of transparent regions in a lateral cross section of the PSL is at least ten percent (f=0.1) of the total area of the lateral cross section. In a more particular embodiment, the total area of the set of transparent regions is between approximately thirty and sixty percent of the total area of the lateral cross section.

It is important to observe that the average distance between inhomogeneities should be on the order of current spreading length in order for the device to have uniform current/light emission throughout the semiconducting layers. Current spreading length in one period of a PSL is given by:

$$L_{spread} = \sqrt{\frac{lkT}{q\rho J_0}},$$

where l is the thickness of a period layer, $\rho$ is the resistivity of a current spreading layer, and $J_0$ is a current density. Using this formula, the current spreading length is estimated to be between approximately 0.1 μm and approximately 1 μm.

As discussed herein, the set of higher conductive regions can be configured to keep the voltage drop across the layer within a desired range. In an embodiment, a target resistance per area for the layer can be calculated based on attributes of the layer and attributes of the operating environment for the device. For example, an illustrative device configuration can include a layer that is 200 nanometers thick and has a lateral cross sectional area of 200 micrometers by 200 micrometers, a target voltage drop of one Volt across the layer, and an operating current of 0.02 Amperes. In this case, a target total resistance of the layer can be calculated as 1 Volt/0.02 Amps=50 Ohms, and a target resistivity of the layer can be calculated as:

$$50 \text{ Ohms} \times 4 \times 10^{-8}/(2 \times 10^{-7})=10 \text{ Ohm·m}.$$

Using a target resistivity of 1000 Ohm*cm, a target resistance per area of a 200 nanometer thick layer can be calculated as:

$$1000 \text{ Ohm·cm} \times 2 \times 10^{-5} \text{ cm} = 2 \times 10^{-2} \text{ Ohm·cm}^2.$$

Figure 18:
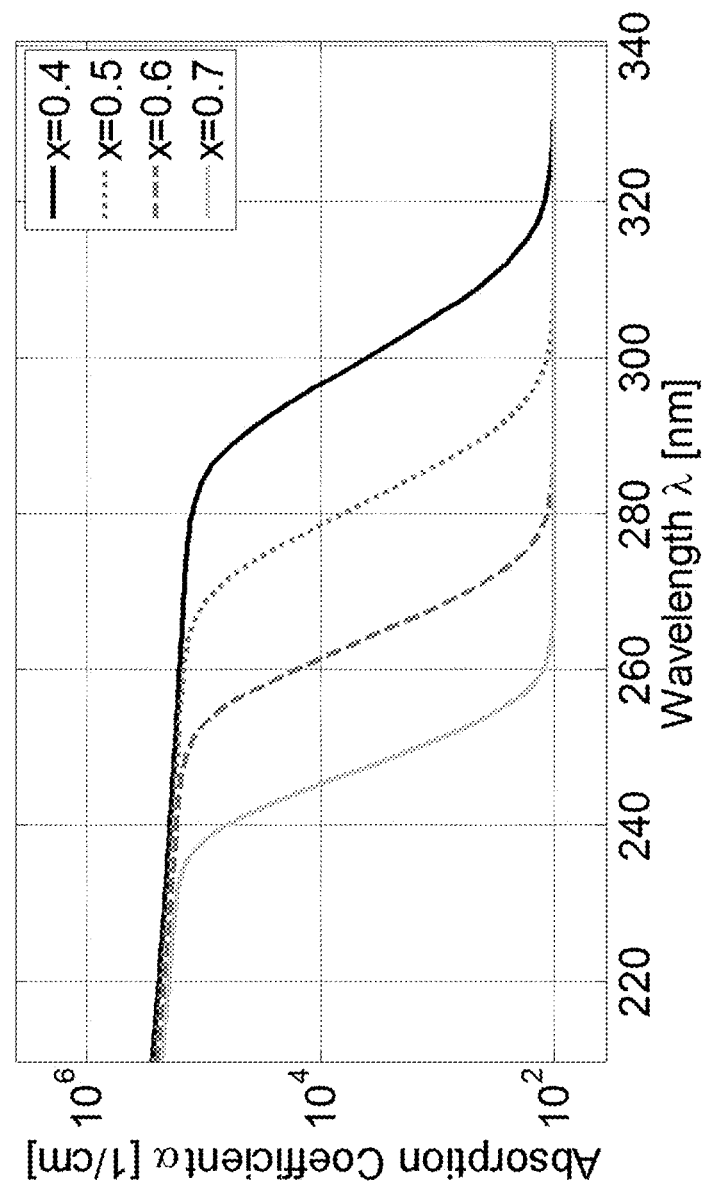
FIG. 18 shows a typical dependence of the absorption coefficient on the wavelength for various aluminum molar fractions in a $Al_xGa_{1-x}N$ alloy according to an embodiment.
Figure 19:
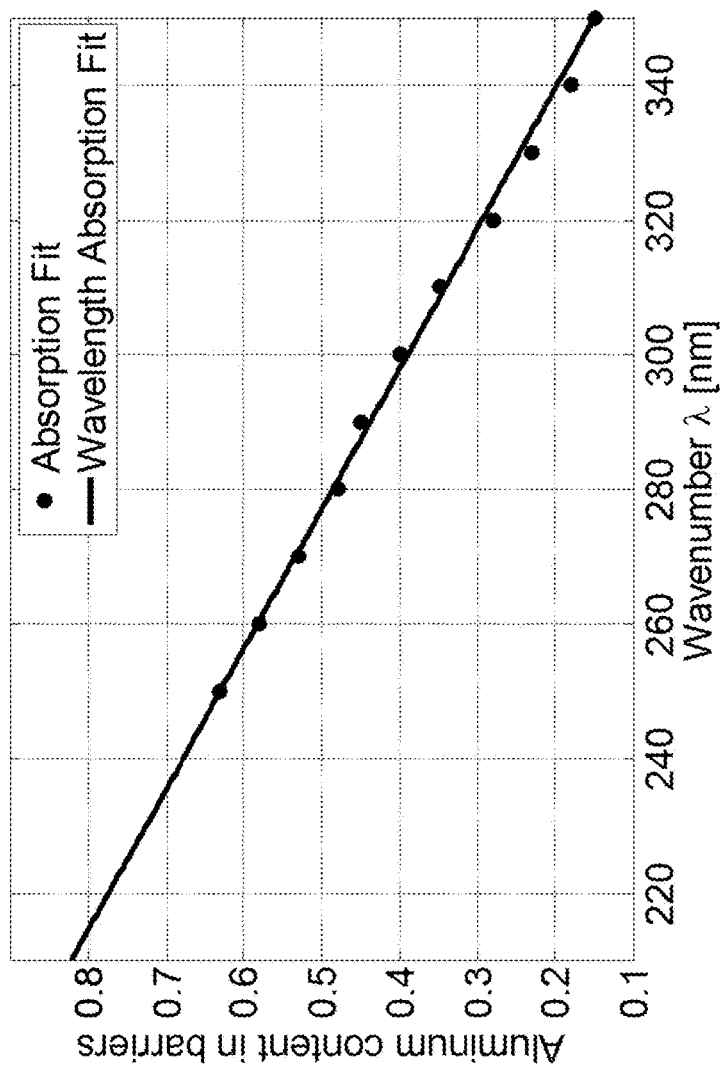
FIG. 19 shows how the content of the aluminum can be chosen for each emitted wavelength according to an embodiment.

The transparency of a short period superlattice (SPSL) can be calculated by either averaging the optical absorption and refraction coefficients of the SPSL or computing absorption and reflection coefficients numerically using Maxwell equations. The absorption coefficients, $\alpha$, depend on the absorption edge of the semiconductor material which is a function of the molar fractions x, y, and z of a $Ga_z In_y Al_x B_{1-x-y-z} N$ semiconductor alloy for a group III nitride semiconductor material. FIG. 18 shows a typical dependence of the absorption coefficient on the wavelength for various aluminum molar fractions in a $Al_x Ga_{1-x} N$ alloy according to an embodiment. In order to maintain a target absorption coefficient of a p-type layer at orders of $10^4$ inverse centimeters, the content of aluminum in the SPSL barriers can be carefully chosen for each emitted wavelength. FIG. 19 shows how the content of the aluminum can be chosen for each emitted wavelength according to an embodiment. Note that the dependence of $x=x(\lambda)$ is linear, with $$x=-0.0048\lambda+1.83.$$

To this extent, x can provide a threshold value for a molar fraction of aluminum, which can be selected to be approximately equal to or exceed the threshold value.

It is understood that aspects of the invention can be incorporated into various types of structures/devices, solutions for designing the various types of structures/devices, and/or solutions for fabricating the various types of structures/devices.

For example, an embodiment of the invention can be implemented as part of a solution for designing and/or fabricating a structure and/or a resulting device/structure as described in U.S. patent application Ser. No. 12/987,102, titled "Superlattice Structure," which was filed on 8 Jan. 2011, and which claims the benefit of U.S. Provisional Application No. 61/293,614, titled "Superlattice Structures and Devices," which was filed on 8 Jan. 2010, both of which are hereby incorporated by reference. Similarly, an embodiment of the invention can be implemented as part of a solution for designing and/or fabricating a structure and/or a resulting device/structure as described in U.S. patent application Ser. No. 13/162,895, titled "Superlattice Structure," which was filed on 17 Jun. 2011, which is hereby incorporated by reference. In either case, the structure/device can comprise a superlattice layer including a plurality of periods, each of which is formed from a plurality of sub-layers. Each sub-layer comprises a different composition than the adjacent sub-layer(s) and comprises a polarization that is opposite a polarization of the adjacent sub-layer(s). Furthermore, one or more of the sub-layers can comprise lateral region(s) configured to facilitate the transmission of radiation, such as ultraviolet radiation, through the layer and lateral region(s) configured to facilitate current flow through the sub-layer as described herein.

Furthermore, an embodiment of the invention can be implemented as part of a solution for designing and/or fabricating a structure and/or a resulting device/structure as described in U.S. patent application Ser. No. 12/960,476, titled "Semiconductor Material Doping," which was filed on 4 Dec. 2010, and which claims the benefit of U.S. Provisional Application No. 61/266,523, titled "Method of Doping and Semiconductor Devices," which was filed on 4 Dec. 2009, both of which are hereby incorporated by reference. Similarly, an embodiment of the invention can be implemented as part of a solution for designing and/or fabricating a structure and/or a resulting device/structure as described in U.S. patent application Ser. No. 13/162,908, titled "Semiconductor Material Doping," which was filed on 17 Jun. 2011, which is hereby incorporated by reference. In either case, the structure/device can comprise a superlattice structure as described herein, in which a target band discontinuity between a quantum well and an adjacent barrier is selected to coincide with an activation energy of a dopant for the quantum well and/or barrier. For example, a target valence band discontinuity can be selected such that a dopant energy level of a dopant in the adjacent barrier coincides with a valence energy band edge for the quantum well and/or a ground state energy for free carriers in a valence energy band for the quantum well. Additionally, a target doping level for the quantum well and/or adjacent barrier can be selected to facilitate a real space transfer of holes across the barrier. The quantum well and the adjacent barrier can be formed such that the actual band discontinuity and/or actual doping level(s) correspond to the relevant target(s).

Furthermore, an embodiment of the invention can be implemented as part of a solution for designing and/or fabricating a structure and/or a resulting device/structure as described in U.S. patent application Ser. No. 13/161,961, titled "Deep Ultraviolet Light Emitting Diode," which was filed on 16 Jun. 2011, and which claims the benefit of U.S. Provisional Application No. 61/356,484, titled "Deep Ultraviolet Light Emitting Diode," which was filed on 18 Jun. 2010, both of which are hereby incorporated by reference. In this case, the structure/device, such as a light emitting diode, can include an n-type contact layer and a light generating structure, which includes a set of quantum wells, adjacent to the n-type contact layer. The contact layer and light generating structure can be configured so that a difference between an energy of the n-type contact layer and an electron ground state energy of a quantum well is greater than an energy of a polar optical phonon in a material of the light generating structure. Additionally, the light generating structure can be configured so that its width is comparable to a mean free path for emission of a polar optical phonon by an electron injected into the light generating structure. The diode can include a blocking layer, which is configured so that a difference between an energy of the blocking layer and the electron ground state energy of a quantum well is greater than the energy of the polar optical phonon in the material of the light generating structure. The diode can include a composite contact, including an adhesion layer, which is at least partially transparent to light generated by the light generating structure and a reflecting metal layer configured to reflect at least a portion of the light generated by the light generating structure. The n-type contact layer, light generating structure, blocking layer, and/or composite contact can include a superlattice configured as shown and described herein.

Figure 20B:
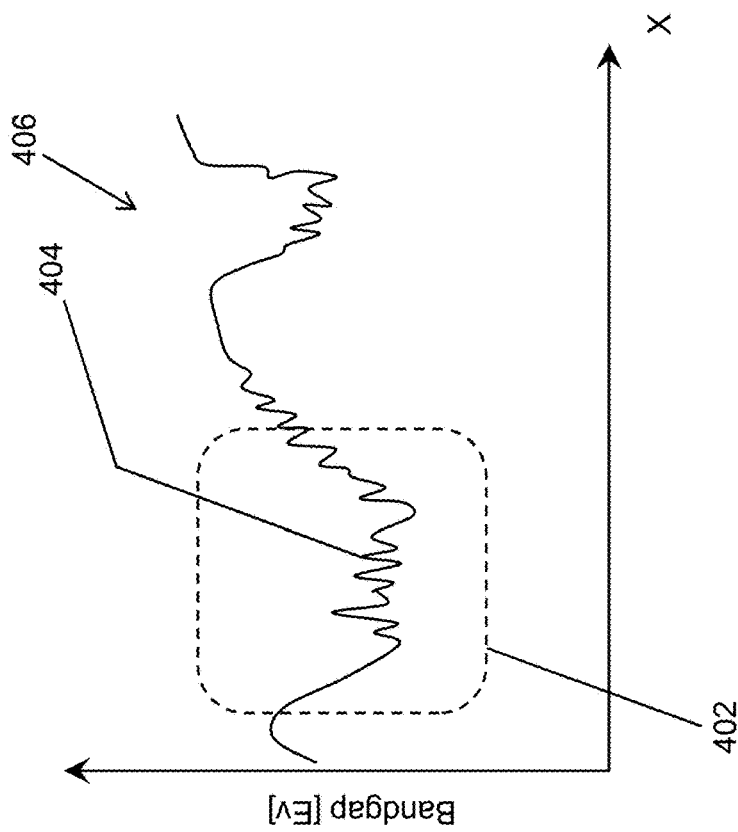
FIGS. 20A and 20B show the distribution of inhomogeneities containing two scales for an illustrative semiconductor layer according to an embodiment.
Figure 20A:
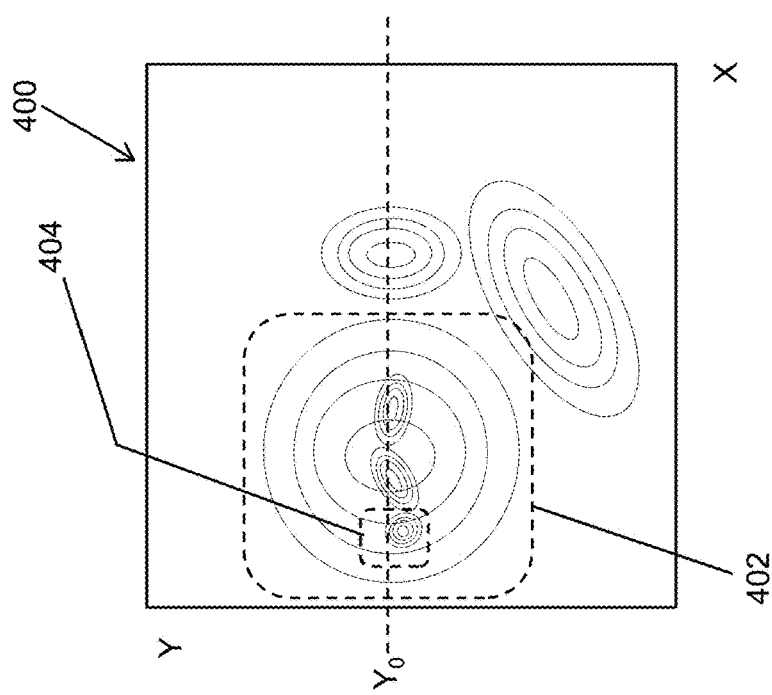

Another embodiment of the present invention is illustrated in FIGS. 20A-20B. In particular, FIGS. 20A-20B show the distribution of inhomogeneities in an illustrative semiconductor layer according to two scales. The semiconductor layer can comprise a p-type contact layer, a p-type superlattice, or one of the quantum well or barrier layers within an active structure. In FIG. 20A, the distribution of inhomogeneities are depicted as a contour map 400. In particular, the contour map 400 illustrates the bandgap variation of the inhomogeneities in the layer, with the lines of the contours representative of values of a constant bandgap. As shown in FIG. 20A, the bandgap variation of the inhomogeneities can include large domains 402 and small domains 404. Although FIG. 20A depicts only one large domain 402 and one small domain 404 for purposes of clarity, it is understood that a contour map for the distribution of inhomogeneities of a layer can have additional large and small domains. In one embodiment, the large domains 402 can include valleys or hills that represent the inhomogeneities distribution, while the small domains 404, which are superimposed over the large domains, can also include valleys or hills that represent the inhomogeneities distribution, but in a more specific location within a large domain. In one embodiment, the large domains 402 provide a first scale, while the small domains 404 provide a second scale. In this manner, the first scale of the large domains and the second scale of the small domains 404 can be used to improve conductivity of the semiconductor layer (large scale fluctuations) and improve carrier localization (small scale fluctuations).

In FIG. 20B, the distribution of inhomogeneities are depicted in a plot 406 of bandgap 400 versus a range of values of X. In particular, the plot 406 shows a representative cut of the bandgap variation of the inhomogeneities in the layer at a constant value $Y=Y_0$, for a range of values of X, where X and Y are the lateral spatial coordinates of the layer. Like FIG. 20A, the bandgap variation of the inhomogeneities depicted in FIG. 20B can include large domains 402 and small domains 404 to represent the fluctuations of the inhomogeneities in the layer. The large domains 402 correspond to large valley/hill regions and are representative of a first scale, while the small domains 404 correspond to finer valley/hill regions and are representative of a second scale.

In one embodiment, the scales can be measured, for example, by computing local averages of bandgaps within each sub-unit of area Ai of the layer. For example, one can first start by subdividing the area by large sub-regions Al and calculating the average bandgap on each sub-region to determine the large scale. Then finer subdivision of an area and calculation of average bandgap for each region can yield details about the finer scales. In this manner, the large scale inhomogeneity can be selected such that its characteristic size is smaller than an inverse of a dislocation density for the semiconductor layer. This can result in a reduction of non-radiative recombination by preventing carriers to be captured at the dislocation cores.

FIGS. 21A-21C illustrate another embodiment of the present invention. In particular, FIGS. 21A-21C show examples of arrangements of a set of transparent regions and a set of conductive regions within different layers of a semiconductor with the sets having periodic structures that are spatially-shifted between neighboring layers according to an embodiment. For example, in one embodiment illustrated in FIG. 21A, a semiconductor 408 can include a laminate of layers LA, LB, LC and LD. It is understood that the layers LA, LB, LC and LD in the laminate depicted in FIG. 21A are only illustrative of one possible configuration and are not meant to limit the scope and breadth of the embodiments described herein. The laminate of layers LA, LB, LC and LD can each include a set of transparent regions 410. As shown in FIG. 21A, the layer LA has transparent regions 410A, the layer LB has transparent regions 410B, the layer LC has transparent regions 410C, and the layer LD has transparent regions 410D. The transparent regions in each of the layers LA, LB, LC and LD can be structured laterally along the layer in a periodic distribution. In one embodiment, the transparent regions are spatially phase-shifted in relation to the periodic distribution of the transparent regions in immediately adjacent or neighboring layers. As used herein, a periodic distribution means a distribution that can have a characteristic length scale distance between regions in a layer, and have a characteristic length scale of the region, wherein the characteristic length scale can be obtained by examining the average length scale and standard deviation from such length scale. This definition of a periodic distribution also covers semi-periodic distributions. The periodic distribution regions within layers LA, LB, LC and LD of semiconductor 408 can be obtained through patterning, or semiconductor layer overgrowth. In another embodiment, the periodic distribution can be obtained by selecting a particular epitaxial growth method, such as a three-dimensional epitaxial growth approach which is well-known in art.

As shown in FIG. 21A, the periodic distribution of the transparent regions 410A in the layer LA is shifted relative to the periodic distribution of the transparent regions 410B in the layer LB by a value defined as a phase shift. In FIG. 21A, the phase shift between the transparent regions 410A in the layer LA and the transparent regions 410B in the layer LB is represented by the spacing 412. The phase shift can be selected to promote light extraction efficiency from the device. In one embodiment, the spatial phase-shift of the set of transparent regions in the layers LA, LB, LC and LD can be uniform. In another embodiment, the spatial phase-shift of the set of transparent regions in the semiconductor layers can vary in periodicity among neighboring layers. Generally, the phase shift can be selected to promote light extraction efficiency from the light emitting device in which the structure of this embodiment is configured with.

FIG. 21B is similar to FIG. 21A, except that the semiconductor 414 of this figure can include a set of conductive regions 416 in each of the laminate of layers LA, LB, LC and LD. In this manner, the layer LA has conductive regions 416A, the layer LB has conductive regions 416B, the layer LC has conductive regions 416C, and the layer LD has conductive regions 416D. The conductive regions in each of the layers LA, LB, LC and LD are structured laterally along the layer in a periodic distribution. In one embodiment, the conductive regions are spatially phase-shifted in relation to the periodic distribution of the conductive regions in immediately adjacent or neighboring layers. It is understood that the phase shift of the conductive regions can be the same or different for each of layers LA, LB, LC and LD, and in general, such shift can be selected to yield the best conductivity of the semiconductor layer.

The laminate of layers of the semiconductor are not meant to be limited to having either only a set of transparent regions in the layers or only a set of conductive regions as illustrated in FIGS. 21A-21B, respectively. In one embodiment, the layers of the semiconductor can contain both periodic distributions of transparent regions and conductive regions in the layers. Alternatively, in another embodiment, the layers of the semiconductor can contain both transparent regions and conductive regions, wherein the transparent regions and the conductive regions are structured laterally along a layer in a periodic distribution.

FIG. 21C shows another embodiment in which the laminate semiconductor heterostructures 408 and 414 shown in FIGS. 21A and 21B, respectively can be used as a component of a larger semiconductor heterostructure 418. In one embodiment, as shown in FIG. 21C, the heterostructure 418 can include a first layer 420 comprising the semiconductor laminate structure 408 shown in FIG. 21A, a second layer 422 comprising the semiconductor laminate structure 414 structure shown in FIG. 21B, and a third layer 424 which can include a homogeneous layer of homogeneous semiconductor composition formed between layers 420 and 422. In another embodiment, the heterostructure 418 can include a first layer 420 comprising the semiconductor laminate structure 408 or 414 shown in FIG. 21A or 21B, a second layer 422 also comprising the semiconductor laminate structure 408 or 414 structure shown in FIG. 21A or 21B, separated by the third layer 424. It is understood, that these examples of arrangements of laminate semiconductor heterostructures are only illustrative of a few configurations and those skilled in the art will appreciate that other arrangements of structures are possible and within the scope of the various embodiments described herein.

Figure 22:
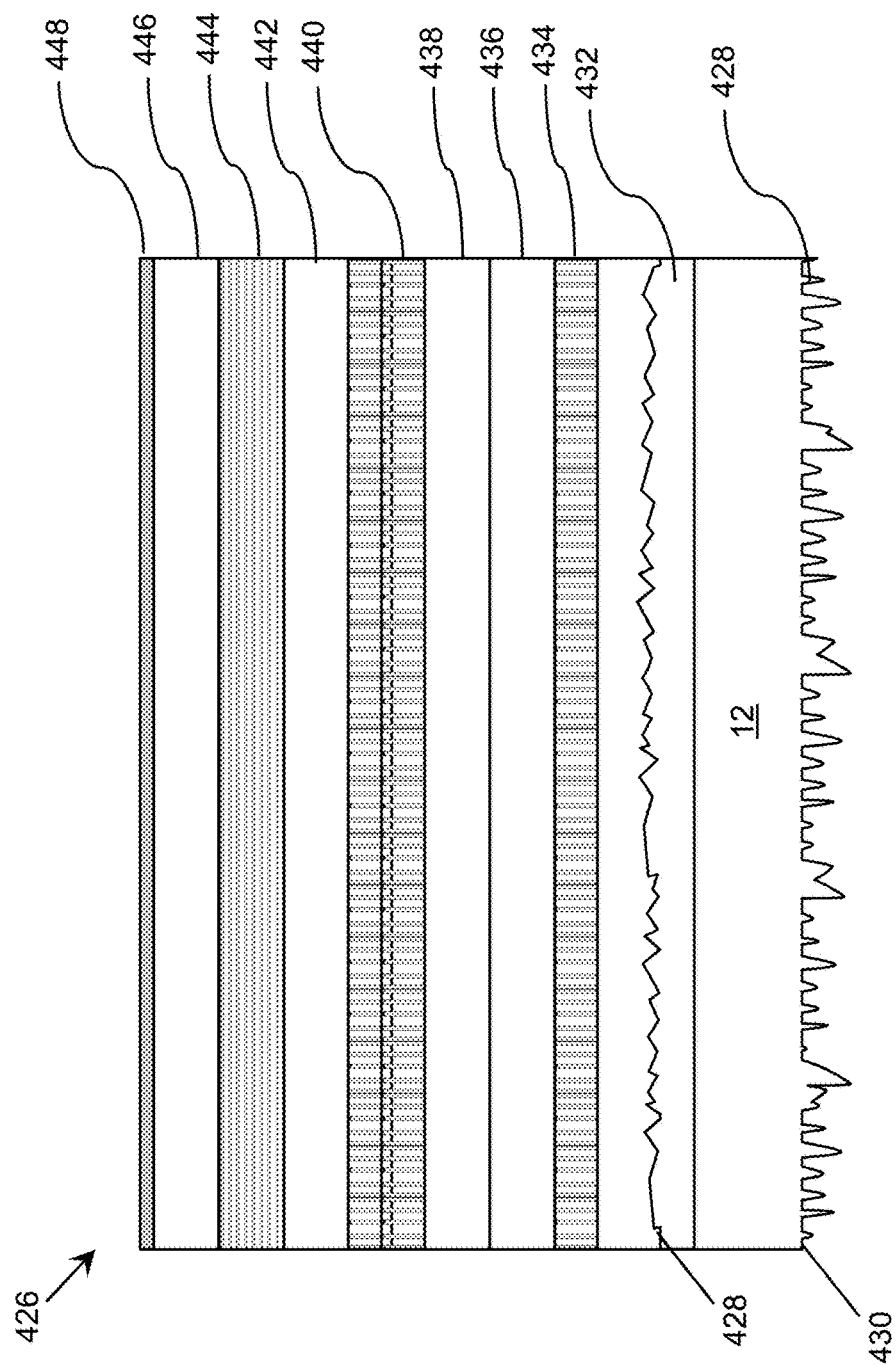
FIG. 22 shows a semiconductor heterostructure grown over a substrate having roughness elements according to an embodiment.

FIG. 22 shows a semiconductor heterostructure 426 grown over a substrate 12 having roughness elements 428 on an exterior side surface 430 of the substrate according to an embodiment. In one embodiment, the roughness elements 428 can be configured to improve light extraction from the semiconductor heterostructure 426 and any optoelectronic device, such as an ultraviolet light emitting diode, that can include the heterostructure 426. As shown in FIG. 22, the roughness elements 428 can be formed on the exterior side surface 430 of the substrate 12 that is opposite a side surface near the interface of the substrate 12 and a semiconductor buffer layer 432 that can be epitaxially grown on the substrate, which can also have roughness elements 428 formed in an interior portion.

The size and shape of the roughness elements 428 in the substrate 12 and the layer 432 can be optimized to improve light extraction from the semiconductor heterostructure 426 and the device that includes the heterostructure. In one embodiment, the roughness elements 428 can include etched domains having a characteristic size that is at least a wavelength of target radiation, such as a peak wavelength of the radiation emitted by the semiconductor heterostructure 426. For example, the etched domains of the roughness elements 428 can include truncated pyramids, inverted pyramids, conical elements, and/or the like. The roughness elements 428 can also include, but are not limited to, protrusions. In one embodiment, the roughness elements 428 can include externally deposited roughness elements comprising shapes of $Al_2O_3$, $SiO_2$, and/or the like. Furthermore, although FIG. 22 shows the roughness elements 428 formed on the side surface 430 of the substrate 12, it is possible to have the roughness elements formed in other locations about the substrate such as within its internal portion, on a facing portion, an edge portion, and/or the like. Similarly, the roughness elements 428 formed on the interior of the layer 432 can be formed on other locations such as a facing portion, an edge portion, and/or the like.

In another embodiment, the roughness elements 428 can be patterned. In this manner, the patterned roughness elements 428 can have a periodic structure or an aperiodic structure. In an embodiment, the patterned roughness elements 428 can form photonic crystals each having a characteristic size that is comparable to the wavelength of the target radiation (e.g., the peak radiation emitted by the semiconductor heterostructure 426). As used herein, a characteristic size that is comparable means a characteristic size within +/−50% of the wavelength of the target radiation. The roughness elements 428 can be patterned using well-known techniques that can include, but are not limited to, etching, deposition, and the like.

As shown in FIG. 22, the semiconductor heterostructure 426 can further include other semiconductor layers grown on the substrate 12 and the layer 432, such as layers 434, 436, 438, 440, 442, 444, 446, and 448. For example, the layers 434 and 440 can include sets of transparent regions and conductive regions according to any one of the various arrangements discussed above with regard to FIGS. 21A-21C. In this manner, each of the sets of transparent regions and conductive regions that can be deployed with the layers 434 and 440 can be formed with characteristic sizes and distances between such regions in a layer and in immediately adjacent layers that are selected to optimize overall efficiency (e.g., wall plug) of the semiconductor heterostructure 426 and the device that can include the heterostructure.

While shown and described herein as a method of designing and/or fabricating an emitting device to improve extraction of light from the device, it is understood that aspects of the invention further provide various alternative embodiments. For example, aspects of the invention can be implemented to facilitate the transmission of light within the device, e.g., as part of optical pumping of a laser light generating structure, excitation of a carrier gas using a laser pulse, and/or the like. Similarly, an embodiment of the invention can be implemented in conjunction with a sensing device, such as a photosensor or a photodetector. In each case, a profiled surface can be included in an exterior surface of the device and/or an interface of two adjacent layers of the device in order to facilitate the transmission of light through the interface in a desired direction.

Figure 23:
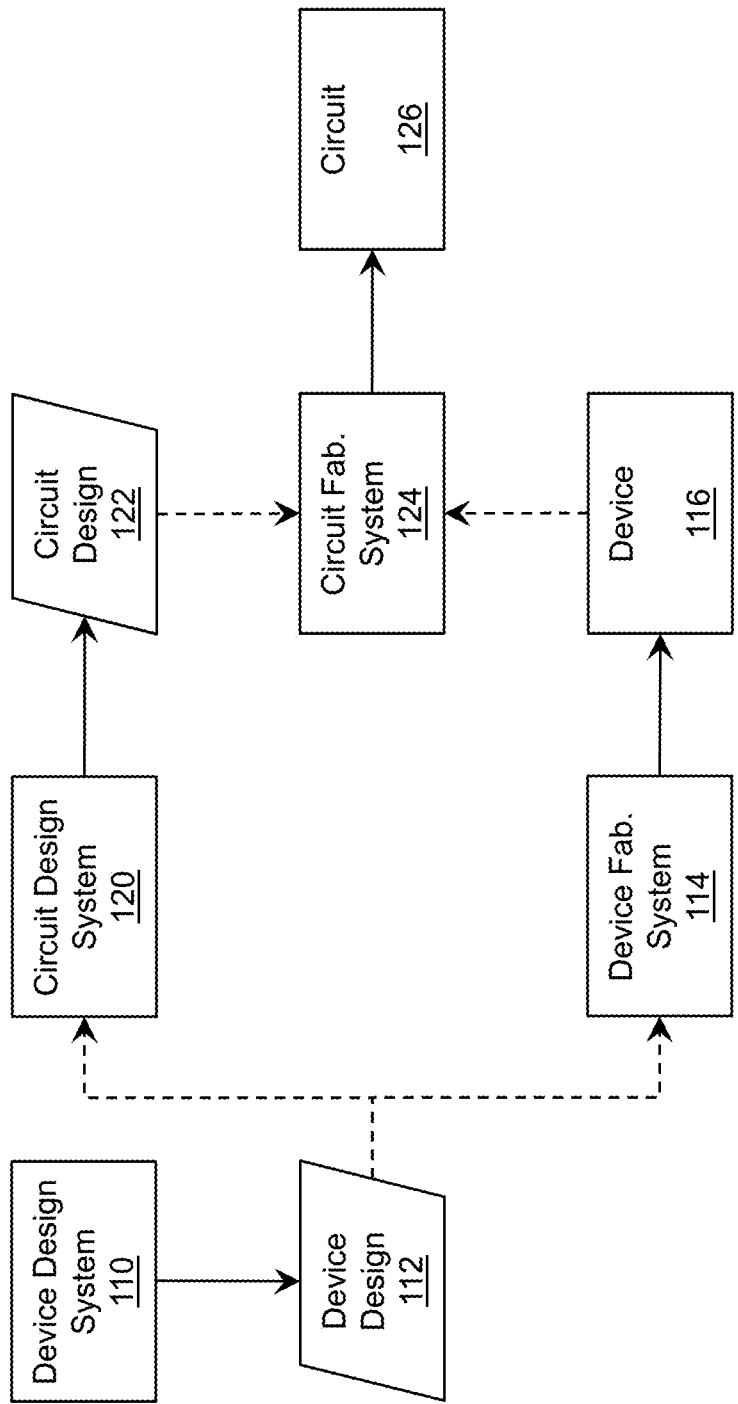
FIG. 23 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 23 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
a short period p-type superlattice (SPSL) semiconductor layer comprising a plurality of barriers alternating with a plurality of quantum wells, wherein a concentration of at least one barrier and a concentration of at least one quantum well varies along lateral dimensions of the SPSL semiconductor layer, wherein a lateral cross section of the at least one barrier includes:
a set of transparent regions, each transparent region having a transmission coefficient for a target radiation wavelength, l, greater than or equal to approximately sixty percent, wherein the set of transparent regions are at least ten percent of an area of the lateral cross section of the at least one barrier; and
a set of higher conductive regions occupying at least two percent of the lateral cross section of the at least one barrier and having an average resistance per unit area to a vertical current flow resulting in a total voltage drop across the SPSL of less than approximately five volts.

2. The device of claim 1, wherein the SPSL semiconductor layer is p-doped with Magnesium.

3. The device of claim 2, wherein the concentration of the Magnesium in at least one quantum well is less than less than $5 \cdot 10^{15}[1/cm^3]$.

4. The device of claim 1, wherein each barrier is formed of an $Al_xGa_{1-x}N$ alloy, where x is a molar fraction of aluminum and where x is selected such that an absorption coefficient of the barrier is at least $10^4$ inverse centimeters.

5. The device of claim 1, wherein the set of higher conductive regions comprises regions with a characteristic bandgap that is at least five percent smaller than a characteristic band gap of the set of transparent regions within the area of the lateral cross section of the at least one barrier.

6. The device of claim 1, wherein each of the plurality of barriers and each of the plurality of quantum wells has a thickness less than or equal to approximately five nanometers.

7. The device of claim 1, wherein the set of transparent regions are interspersed with the set of higher conductive regions in an approximately uniform arrangement throughout the lateral cross section of the at least one barrier.

8. A device, comprising:
a short period superlattice (SPSL) semiconductor layer comprising a plurality of barriers alternating with a plurality of quantum wells, wherein a lateral cross section of each barrier includes:
a set of transparent regions, each transparent region having a transmission coefficient for a target radiation wavelength, l, greater than or equal to approximately sixty percent, wherein the set of transparent regions are at least ten percent of an area of the lateral cross section of the barrier; and
a set of higher conductive regions occupying at least two percent of the lateral cross section of the barrier and having an average resistance per unit area to a vertical current flow resulting in a total voltage drop across the SPSL of less than approximately five volts;
wherein the set of transparent regions and the set of higher conductive regions are formed by a non-uniform compositional distribution along the barrier thickness and/or barrier thickness of each barrier.

9. The device of claim 8, wherein the set of transparent regions and the set of higher conductive regions have a non-uniform doping in addition to the non-uniform compositional distribution.

10. The device of claim 9, wherein the non-uniform doping of the set of transparent regions and the set of higher conductive regions includes a modulation doping with a variation of acceptor concentration that exceeds approximately $1 \times 10^{18}$ $1/cm^3$.

11. The device of claim 8, wherein the set of transparent regions and the set of higher conductive regions are formed using a three-dimensional growth mode.

12. The device of claim 8, wherein the set of transparent regions and the set of higher conductive regions are formed directly on an inhomogeneous layer.

13. The device of claim 8, wherein the set of transparent regions and the set of higher conductive regions are formed using nano-scale inhomogeneities.

14. A device, comprising:
a semiconductor layer comprising a set of group III nitride layers, wherein each one of the group III nitride layers is an inhomogeneous layer comprising at least one of:
a set of transparent regions having a first characteristic band gap, wherein the set of transparent regions are at least ten percent of an area of the lateral cross section of the inhomogeneous layer; and
a set of higher conductive regions having a second characteristic band gap at least five percent smaller than the first characteristic band gap, wherein the set of higher conductive regions occupy at least two percent of the area of the lateral cross section of the inhomogeneous layer,
wherein the set of higher conductive regions comprises $B_wAl_xGa_yIn_zN$, where $0 \le W, X, Y, Z \le 1$, and $W+X+Y+Z=1$.

15. The device of claim 14, wherein a spatial distribution of the set of transparent regions and the set of higher conductive regions within the set of group III nitride layers is uniform.

16. The device of claim 14, wherein a distribution density of the set of transparent regions and the set of higher conductive regions within the set of group III nitride layers varies between adjacent layers.

17. The device of claim 14, wherein at least one of the group III nitride layers comprises both the set of transparent regions and the set of higher conductive regions, wherein the set of transparent regions and the set of higher conductive regions are structured laterally along the inhomogeneous layer in a periodic distribution, with the set of transparent regions alternating with the set of higher conductive regions.

18. The device of claim 14, further comprising at least one homogeneous layer formed between adjacent inhomogeneous layers having one of the set of transparent regions and the set of higher conductive regions.

19. The device of claim 18, wherein the at least one homogeneous layer comprises a surface with roughness elements.

20. The device of claim 2, wherein the concentration of the Magnesium in at least one barrier is greater than $5 \cdot 10^{18}$ $[1/cm^3]$.

* * * * *